(12) United States Patent
Watanabe et al.

(10) Patent No.: US 7,119,009 B2
(45) Date of Patent: Oct. 10, 2006

(54) SEMICONDUCTOR DEVICE WITH DUAL DAMASCENE WIRING

(75) Inventors: Kenichi Watanabe, Kawasaki (JP); Daisuke Komada, Kasugai (JP); Fumihiko Shimpuku, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 75 days.

(21) Appl. No.: 10/898,938

(22) Filed: Jul. 27, 2004

(65) Prior Publication Data

US 2005/0001323 A1 Jan. 6, 2005

Related U.S. Application Data

(62) Division of application No. 09/735,479, filed on Dec. 14, 2000, now Pat. No. 6,787,907.

(30) Foreign Application Priority Data

Jul. 21, 2000 (JP) ............................. 2000-221202

(51) Int. Cl.
*H01L 21/4763* (2006.01)
*H01L 21/302* (2006.01)
*H01L 21/461* (2006.01)

(52) U.S. Cl. .................. 438/624; 438/618; 438/687; 438/690; 438/692; 438/723; 438/636; 257/E21.579; 257/E21.576; 257/E21.259

(58) Field of Classification Search ........ 438/618–638, 438/687–723, 548, 758; 257/E21.579, E21.576
See application file for complete search history.

(56) References Cited

U.S. PATENT DOCUMENTS

| 5,801,094 A | 9/1998 | Yew et al. .................. 438/624 |
| 5,874,201 A * | 2/1999 | Licata et al. ................ 438/640 |
| 5,981,377 A * | 11/1999 | Koyama ..................... 438/633 |
| 6,042,999 A * | 3/2000 | Lin et al. .................... 430/316 |
| 6,060,379 A | 5/2000 | Huang et al. ................ 438/618 |
| 6,096,595 A | 8/2000 | Huang ......................... 438/238 |
| 6,184,142 B1 | 2/2001 | Chung et al. ................ 438/692 |
| 6,211,061 B1 * | 4/2001 | Chen et al. .................. 438/622 |
| 6,211,092 B1 * | 4/2001 | Tang et al. .................. 438/719 |
| 6,251,770 B1 | 6/2001 | Uglow et al. ................ 438/624 |
| 6,284,149 B1 * | 9/2001 | Li et al. ........................ 216/64 |
| 6,316,351 B1 * | 11/2001 | Chen et al. .................. 438/638 |
| 6,319,809 B1 * | 11/2001 | Chang et al. ................ 438/597 |
| 6,319,814 B1 | 11/2001 | Tsai et al. .................... 438/624 |

(Continued)

*Primary Examiner*—B. William Baumeister
*Assistant Examiner*—Igwe U. Anya
(74) *Attorney, Agent, or Firm*—Westerman, Hattori, Daniels & Adrian, LLP.

(57) ABSTRACT

A semiconductor device having: an underlie having a conductive region in the surface layer of the underlie; an insulating etch stopper film covering the surface of the underlie; an interlayer insulating film formed on the insulating etch stopper film; a wiring trench formed in the interlayer insulating film, the wiring trench having a first depth from the surface of the interlayer insulating film; a contact hole extending from the bottom surface of the wiring trench to the surface of the conductive region; and a dual damascene wiring layer embedded in the wiring trench and the contact hole, wherein the interlayer insulating film includes a first kind of an insulating layer surrounding the side wall and bottom surface of the wiring trench and a second kind of an insulating layer having etching characteristics different from the first kind of the insulating layer. The semiconductor device is provided which can protect the underlying conductive region sufficiently and has a dual damascene wiring layer having a high reliability and a small wiring capacitance.

21 Claims, 21 Drawing Sheets

U.S. PATENT DOCUMENTS

| | | | |
|---|---|---|---|
| 6,319,821 B1 * | 11/2001 | Liu et al. | 438/636 |
| 6,326,296 B1 * | 12/2001 | Tsai et al. | 438/624 |
| 6,342,448 B1 * | 1/2002 | Lin et al. | 438/687 |
| 6,365,508 B1 * | 4/2002 | Zhou et al. | 438/627 |
| 6,399,424 B1 * | 6/2002 | Matsuura et al. | 438/125 |
| 6,429,119 B1 * | 8/2002 | Chao et al. | 438/633 |
| 6,455,411 B1 * | 9/2002 | Jiang et al. | 438/624 |
| 6,461,955 B1 * | 10/2002 | Tsu et al. | 438/618 |
| 6,475,810 B1 * | 11/2002 | Zhou et al. | 438/633 |
| 6,506,680 B1 * | 1/2003 | Kim et al. | 438/692 |
| 6,677,231 B1 * | 1/2004 | Tsai et al. | 438/624 |
| 2001/0008226 A1 * | 7/2001 | Hung et al. | 216/18 |
| 2002/0081855 A1 * | 6/2002 | Jiang et al. | 438/694 |

\* cited by examiner

SEMICONDUCTOR DEVICE WITH DUAL DAMASCENE WIRING

This application is a divisional application of prior application Ser. No. 09/735,479 filed Dec. 14, 2000, now U.S. Pat. No. 6,787,907.

This application is based on Japanese Patent Application 2000-221202, filed on Jul. 21, 2000, the entire contents of which are incorporated herein by reference.

BACKGROUND OF THE INVENTION a) Field of the Invention

The present invention relates to a semiconductor device and its manufacture method, and more particularly to a semiconductor device having a dual damascene wiring structure and its manufacture method.

In this embodiment, an "etch stopper" is intended to mean a layer having an etch rate of at most ⅕ times that of a layer to be etched. A "similar etch rate" is intended to mean an etch rate about ½ to about two times that of a layer to be etched.

b) Description of the Related Art

Demands for higher integration of semiconductor devices are increasing. A conventional conductive wire is made of Al, W or the like. After an Al wiring layer or W wiring layer is formed on an insulating layer, an etching mask such as a resist pattern is formed on the wiring layer. This wiring layer is patterned and embedded in an insulating layer to form a wiring pattern.

As the integration degree becomes higher, it is required to narrow the width of a wiring pattern and shorten a space between adjacent conductive wires. Such fine patterns increase the capacitance between wiring patterns. A reduced cross sectional area of a conductive wire results in an increased resistance. An increase in the capacitance or resistance lowers a signal transmission speed in the conductive wire and hinders speeding up the device operation.

In order to reduce the wiring resistance, Cu wiring having a lower resistivity than Al and W has been adopted. Cu is difficult to be patterned by etching. A damascene wiring process is used for forming a Cu wiring pattern. Namely, a wiring trench is formed in a surface layer of an insulating film, a wiring layer is embedded in this wiring trench, and an unnecessary wiring layer on the surface of the insulating film is removed by chemical mechanical polishing (CMP).

It is necessary to interconnect wiring layers by using via conductors. A single damascene process and a dual damascene process are known as the damascene process. In the single damascene process, after a via hole is embedded with a via conductor, a wiring trench is formed and embedded with wiring material. In the dual damascene process, after a via hole and a wiring trench are formed, they are embedded with wiring material at the same time. The dual damascene process is superior in terms of process simplification.

A via first process and a trench first process are known as the dual damascene process. The former forms first a via hole and then a wiring trench, whereas the latter forms first a wiring trench and then a via hole. The via first process is considered superior in terms of reliable connection to the underlie.

With reference to FIGS. 11A to 11H, an example of the via first dual damascene process will be described.

As shown in FIG. 11A, on the surface of an underlie 110 having a conductive region 111, a first etch stopper layer 112 of SiN or the like is formed. The underlie may be a semiconductor substrate or an insulating layer formed on the substrate. The conductive region 111 may be a semiconductor region or a wiring layer. If the conductive region 111 is a Cu wire, the etch stopper layer 112 is needed to cover the Cu wire because the surface of the Cu wire is oxidized very easily.

On the first etch stopper 112, a first interlayer insulting film 113 of silicon oxide or the like is formed. On the first interlayer insulating film 113, a second etch stopper 114 of SiN or the like is formed which functions as an etch stopper while a wiring trench is formed thereon. On the second etch stopper 114, a second interlayer insulating film 115 of silicon oxide or the like is formed in which the wiring trench is formed. On the second interlayer insulating film 115, an insulating antireflection film 116 of SiN or the like is formed which presents an antireflection function while a resist layer is patterned.

As shown in FIG. 11B, a resist layer is formed on the insulating antireflection film 116, and exposed and developed to form a resist pattern PR1. The resist pattern PR1 is formed with an opening 101 corresponding to a via hole.

By using the resist pattern PR1 as an etching mask, the antireflection film 116, second interlayer insulating film 115, second etch stopper layer 114 and first interlayer insulating film 113 are anisotropically etched to form a via hole 102 in register with the opening 101 in the resist pattern PR1. If an over-etch is performed, the first etch stopper layer 112 is etched slightly. In some cases, the first etch stopper layer 112 may be completely etched and the underlying conductive region 111 may be damaged. The resist pattern PR1 is thereafter removed.

As shown in FIG. 11C, a resist layer is formed on the antireflection film 116, and exposed and developed to form a second resist pattern PR2. The resist pattern PR2 is formed with an opening 103 corresponding to a wiring trench in an area inclusive of the via hole 102.

As shown in FIG. 11D, by using the resist pattern PR2 as an etching mask, the antireflection film 116 and second interlayer insulating film 115 are etched. In this etching, the second etch stopper layer 114 functions as an etching stopper.

During this etching process shown in FIG. 11D, if the quality and thickness of the first etch stopper layer 112 are insufficient, the first etch stopper 112 may be etched and the surface of the underlying conductive region 111 may be damaged.

As shown in FIG. 11E, the second resist pattern PR2 is removed by ashing with oxygen plasma. If the first etch stopper layer 112 is not left sufficiently, oxygen plasma during this ashing process may damage the surface of the conductive region 111.

As shown in FIG. 11F, the antireflection film 116 on the second interlayer insulating film 115, the second-etch stopper layer 114 exposed at the bottom of the wiring trench, and the first etch stopper layer 112 exposed in the via hole, are preferably anisotropically etched and removed. Thereafter, a damascene wiring layer 160 is formed.

During these processes, when the wiring trench is formed, the wiring trench etching is stopped at the second etch stopper layer 114. The etch stopper layer 114 is therefore left on the bottom of the wiring trench. Even if the exposed second etch stopper layer is removed, the side wall of the second etch stopper 114 layer contacts the side wall of the dual damascene wiring layer 160.

An insulating film having an etch stopper function has generally a high dielectric constant. If such an etch stopper exists at the side wall of the wiring trench, a capacitance between adjacent wiring patterns increases. In order to avoid this, a process has been proposed which does not use the second etch stopper layer when the wiring trench is etched.

As shown in FIG. 11G, after an etch stopper layer 112 and an interlayer insulating film 113 are formed on an underlie 110, an antireflection film 116 is formed on the surface of the interlayer insulating film 113. A resist pattern is formed on the antireflection film 116. Similar to the above-described processes, a via hole 102 is formed reaching the etch stopper 112. Thereafter, a resist pattern PR2 is formed for forming a wiring trench.

As shown in FIG. 11H, by using the resist pattern PR2 as a mask, the antireflection film 116 is etched and thereafter the first interlayer 113 is etched by a predetermined thickness through controlled etching. Since an etching stopper is not used, this etching depth is controlled by an etch time. In this manner, a wiring trench 104 continuous with the via hole 102 is formed. Because an etch stopper layer is not used, the shoulder of the via hole is etched so that the cross sectional area of the via hole gradually increases toward the upper area.

Also in this example, if the first etch stopper layer 112 is etched during etching of the via hole 102 and/or wiring trench 104, the surface of the underlying conductive region 111 may be damaged.

With the via first dual damascene process, there is a possibility that the etch stopper layer on the bottom of the via hole is damaged so that the underlying conductive region is damaged.

In order to make the conductive region under the via hole not susceptible to damages, a process has been proposed by which a filler is placed in a via hole.

FIGS. 12A to 12E illustrate an example of the process of placing a filler in a via hole and thereafter forming a wiring trench by utilizing an etch stopper layer.

As shown in FIG. 12A, on an underlie 110 having a conductive region 111, a laminated structure is formed having a first etch stopper layer 112, a first interlayer insulating film 113, a second etch stopper layer 114, a second interlayer insulating film 115 and an antireflection film 116. A via hole 102 reaching the first etch stopper layer 112 is formed by using a resist pattern.

A filler 155 used as an etching protective member or material is embedded in the via hole 102 at a deeper position. On the antireflection film 116, a resist pattern PR2 is formed having an opening 103 corresponding to a wiring trench.

As shown in FIG. 12B, by using the resist pattern PR2 as an etching mask, the antireflection film 116 and second interlayer insulating film 115 are anisotropically etched. In this case, the first etch stopper layer 112 on the bottom of the via hole 102 can be protected from etching because the layer 112 is covered with the filler 155.

As shown in FIG. 12C, the resist pattern PR2 is removed by ashing. If the filler 155 is made of organic substance, it can be removed at the same time by this ashing. It is also possible to remove the filler 155 and resist pattern PR2 by different processes.

The first etch stopper layer 112 is not etched by the etching process for the wiring trench. Therefore, the ashing process rarely damages the conductive region 111 under the first etch stopper layer 112.

As shown in FIG. 12D, the antireflection film 116 on the second interlayer insulating film 115, the second etch stopper layer 114 exposed on the bottom of the wiring trench, and the first etch stopper layer 112 exposed in the via hole, are etched and removed. In this manner, the wiring trench and via hole continuous with the underlying conductive region 111 are formed.

As shown in FIG. 12E, a wiring layer is deposited and this wiring layer on the surface of the second interlayer insulating film 115 is removed by CMP to form a dual damascene wiring pattern 160 embedded in the via hole and wiring trench.

As described above, unless a filler is used, a conventional dual damascene process is not always easy to sufficiently protect the surface of a conductive region disposed under a dual damascene wiring pattern and form a highly reliable wiring structure.

SUMMARY OF THE INVENTION

It is an object of the present invention to provide a method of manufacturing a semiconductor device having a highly reliable dual damascene structure capable of sufficiently protecting the surface of an underlying conductive layer.

It is another object of the present invention to provide a semiconductor device having a structure suitable for incorporating a dual damascene process.

According to one aspect of the present invention, there is provided a semiconductor device comprising: an underlie having a conductive region in a surface layer of the underlie; an insulating etch stopper film covering a surface of the underlie; an interlayer insulating film formed on the insulating etch stopper film; a wiring trench formed in said interlayer insulating film, the wiring trench having a first depth from a surface of the interlayer insulating film; a contact hole extending from a bottom surface of said wiring trench to a surface of the conductive region via a remaining thickness of the interlayer insulating film and via the insulating etch stopper film; and a dual damascene wiring layer embedded in the wiring trench and the contact hole, wherein the interlayer insulating film includes a first kind of an insulating layer surrounding a side wall and the bottom surface of the wiring trench and a second kind of an insulating layer disposed under the first kind of the insulating layer and having etching characteristics different from the first kind of the insulating layer.

According to another aspect of the present invention, there is provided a method of manufacturing a semiconductor device, comprising the steps of: forming an insulating etch stopper film on an underlie having a conductive region in a surface layer of the underlie; forming an interlayer insulating film on the insulating etch stopper film, the interlayer insulating film including a first kind of an insulating layer and a second kind of an insulating layer formed under the first kind of the insulating film, the second kind of the insulating film having etching characteristics different from the first kind of the insulating film; forming a first contact hole extending from a surface of the interlayer insulating film to the insulating etch stopper film via the interlayer insulating film; embedding an organic protective filler in the contact hole to a height lower than a surface of the second kind of the insulating layer; forming a wiring trench in the first kind of the insulating film of the interlayer insulating film, the wiring trench having a first depth from the surface of the interlayer insulating film and overlapping or including the first contact hole as viewed in plan; removing the protective filler; and forming a dual damascene wiring layer embedded in the wiring trench and the first and second contact holes.

A manufacture method is provided for manufacturing a semiconductor device having a dual damascene wiring structure less damaging an underlying conductive region. A semiconductor device having an appropriate dual damascene wiring structure is provided. Wiring structure forming techniques are provided for forming a wiring structure rarely damaging an underlying conductive region even if a filler in a via hole is not used.

DETAILED DESCRIPTION OF THE PREFERRED EMBODIMENTS

The present inventors have studied more in detail the problems associated with conventional techniques. In the processes shown in FIGS. 12A to 12E, if the first etch stopper layer 112 is to be protected more reliably, it is necessary to make the filler 155 thicker. However, the height of the filler 155 is restricted since the height of the via hole 102 is predetermined.

If the height of the filler 155 is made low, the filler 155 may be completely etched when the wiring trench is formed, and the first etch stopper layer 112 exposed on the bottom of the via hole may be damaged.

The height of the filler 155 should be made high in order not to damage the first etch stopper layer. However, if the filler 155 is made higher than the second etch stopper layer 114, the protective filler works as an etching mask while the wiring trench is etched in such a manner that the interlayer insulating film on the side wall of the protective filler is not etched. This phenomenon is called shadowing.

If shadowing occurs, etching residue is left on the side wall of the filler 155. This etching residue on the shoulder of the via hole or nearby wiring trench is likely to form defective devices at the later process of embedding metal such as Cu.

FIGS. 13A to 13E illustrate an example of a dual damascene process using a filler when an etch stopper layer is not formed on the bottom of a wiring trench.

Figure 13A:
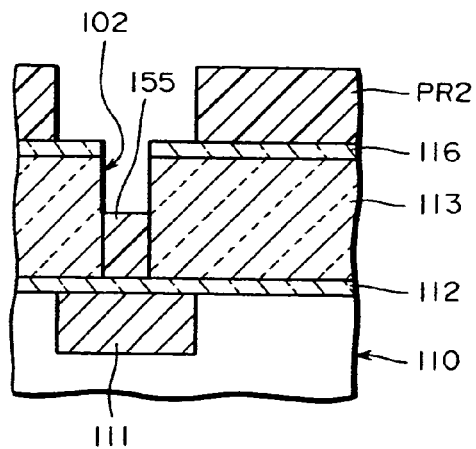
FIGS. 13A to 13E are cross sectional views of a semiconductor substrate illustrating another semiconductor device manufacture method according to conventional techniques.

As shown in FIG. 13A, on an underlie 110 having a conductive region 111, a laminated structure is formed having an etch stopper layer 112, an interlayer insulating film 113 and an antireflection film 116. After a via hole 102 is formed by using a resist pattern, a filler 155 is placed on the bottom of the via hole. Thereafter, a resist pattern PR2 for forming a wiring trench is formed on the surface of the antireflection film 116.

Figure 13D:
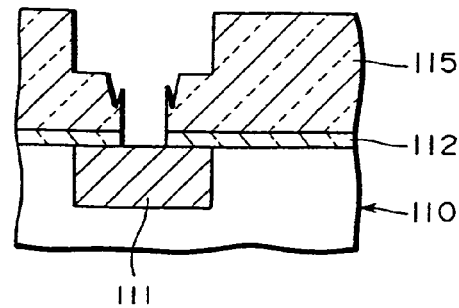
Figure 13B:
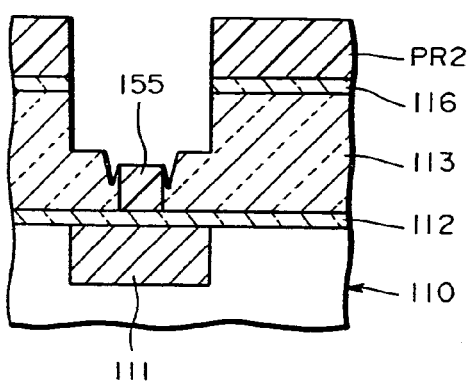

As shown in FIG. 13B, by using the resist pattern PR2 as an etching mask, the antireflection film 116 and interlayer insulating film 113 are partially etched. Since the filler 155 is formed on the bottom of the via hole, the underlying etch stopper 112 is not etched.

The filler 155 has etching characteristics different from those of the nearby interlayer insulating film 113. Therefore, the filler 155 functions as a mask and the phenomenon called shadowing occurs. A deep cut is therefore likely to be formed near the side wall of the filler 155. This deep cut has a slanted downward shape relative to the side wall of the filler 155. Therefore, a sharp projection is formed on the interlayer insulating film around the filler 155. This phenomenon is called abnormal etching hereinafter where appropriate.

Figure 13E:
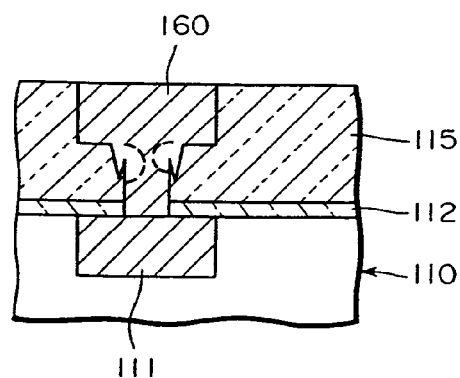
Figure 13C:
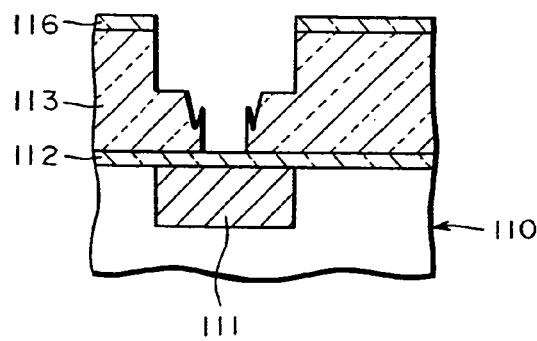

As shown in FIG. 13C, after the wiring trench is formed through etching, the resist pattern PR2 is removed by ashing. If the filler 155 is made of organic substance, the filler 155 is removed at the same time with the resist pattern by ashing. The upper region of the via hole has a sharp projection and a deep cut formed by shadowing.

As shown in FIG. 13D, the antireflection film 116 on the surface of the interlayer insulating film 113 and the etch stopper layer 112 exposed in the via hole are etched.

As shown in FIG. 13E, a dual damascene wiring layer 160 is embedded in the wiring trench and in the via hole. When this wiring layer 160 is formed, voids are likely to be formed because the sharp projection and deep cut are formed around the via hole. These voids may cause insufficient electrical connection between the lower wiring 111 and upper wiring 160.

The present inventors have studied how abnormal etching and underlying conductor damages such as shown in FIGS. 13A to 13E are formed. The contents of these studies will be described with reference to FIGS. 14A to 14D, FIGS. 15A to 15D and FIGS. 16A to 16D.

Figure 14A:
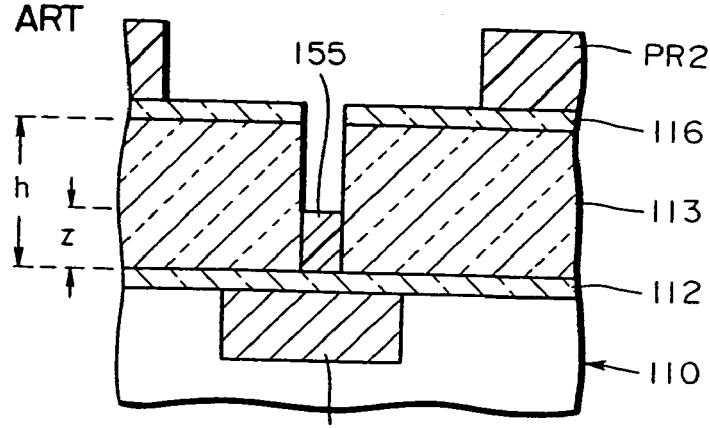
FIGS. 14A to 14D are cross sectional views of a semiconductor substrate illustrating analysis on a manufacture method for a wiring structure according to conventional techniques.

As shown in FIG. 14A, on the surface of an underlie 110 having a conductive region 111, an etch stopper layer 112 and an interlayer insulating film 113 having a sufficient thickness of, for example, 1 μm or thicker are formed and thereafter an antireflection film 116 is stacked. After a resist mask is formed on the antireflection film 116, a via hole is formed reaching the surface of the etch stopper layer 112. After the resist pattern used for the via hole is removed, a resist pattern PR2 for forming a wiring trench is formed. Then, a filler 155 is disposed or applied in the via hole. In the example shown in FIG. 14A, the filler 155 has a thickness of 600 nm.

Figure 15A:
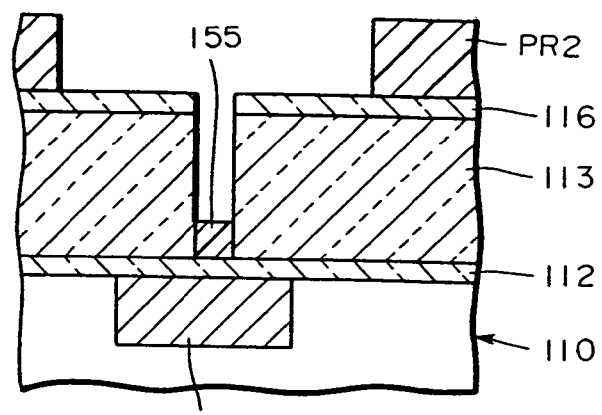
FIGS. 15A to 15D are cross sectional views of a semiconductor substrate illustrating analysis on another manufacture method for a wiring structure according to conventional techniques.
Figure 16A:
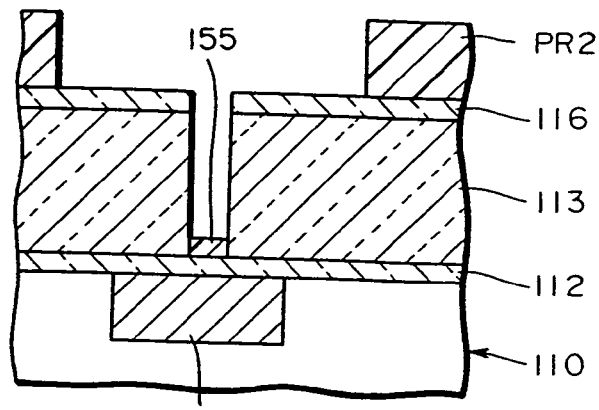
FIGS. 16A to 16D are cross sectional views of a semiconductor substrate illustrating analysis on still another manufacture method for a wiring structure according to conventional techniques.

In the example shown in FIG. 15A, a filler 155 of 400 nm in height is formed, and in the example shown in FIG. 16A, a filler 155 of 200 nm in height is formed. The other conditions are similar to those of the example shown in FIG. 14A. Studies are made on the dependency of different heights of the filler upon changes in the process of forming a wiring trench through etching.

Figure 14B:
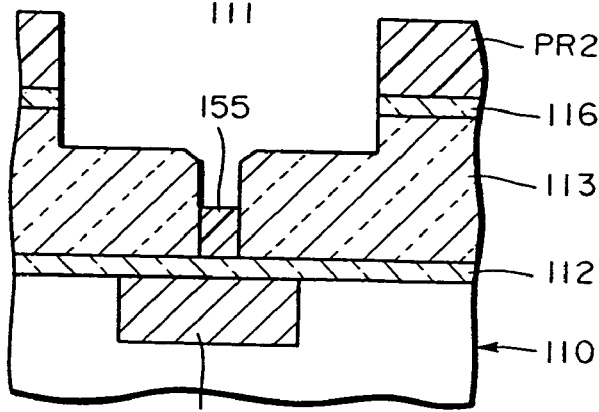
Figure 15B:
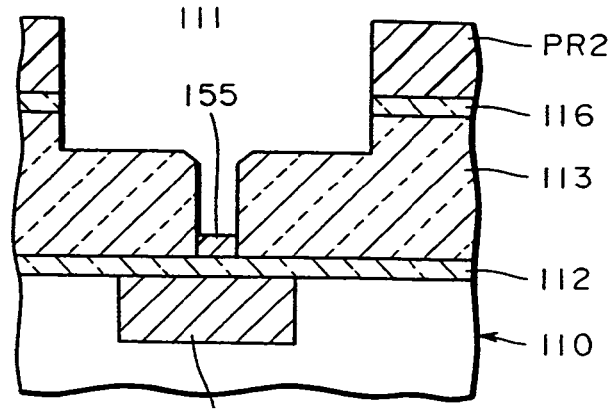
Figure 16B:
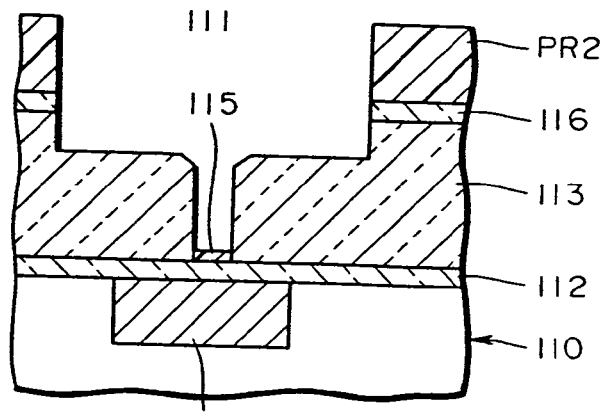

All the examples shown in FIGS. 14B, 15B and 16B show the states that the wiring trenches were formed by etching the interlayer insulating films 113 by 400 nm. As the interlayer insulating film 113 is etched, the filler 155 is also etched. However, in these examples, the fillers 155 in the via holes are not completely etched but partially left. The upper edge (shoulder) of the via hole is etched obliquely.

Figure 14C:
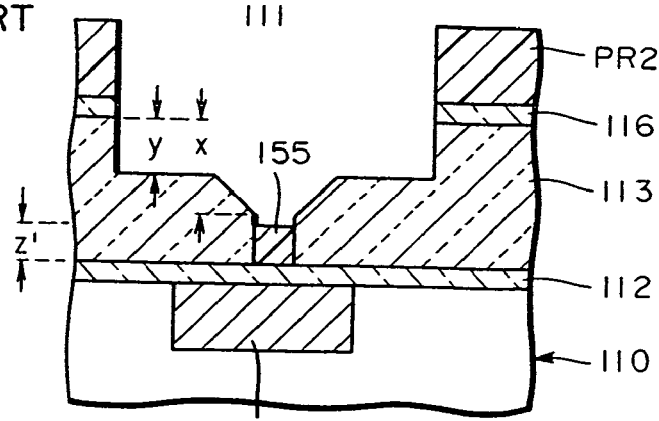
Figure 15C:
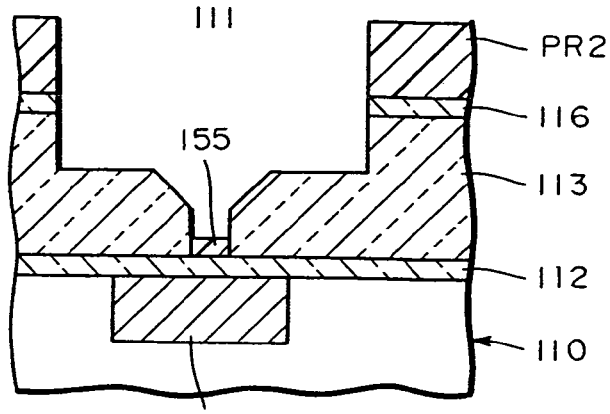
Figure 16C:
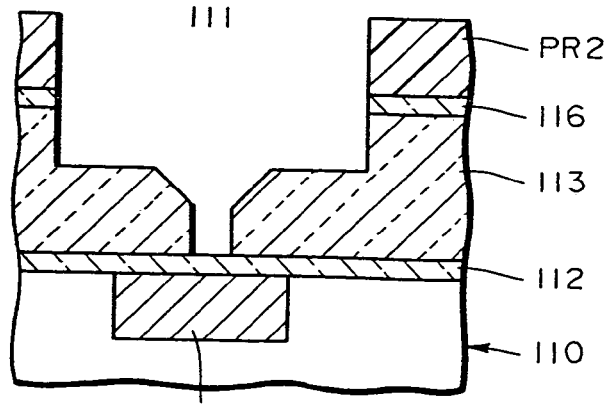

The examples shown in FIGS. 14C, 15C and 16C show the states that the wiring trenches having a depth of 600 nm were formed through etching. In the example shown in FIG. 16C, the filler 155 having the initial height of 200 nm was completely etched. If the etching is performed further, the etch stopper layer 112 under the via hole will be influenced.

Figure 14D:
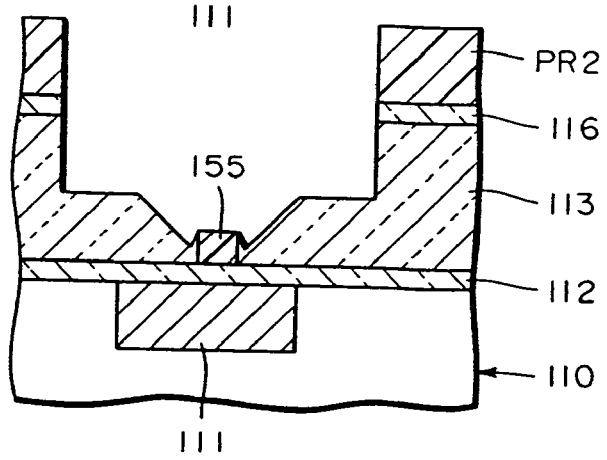
Figure 15D:
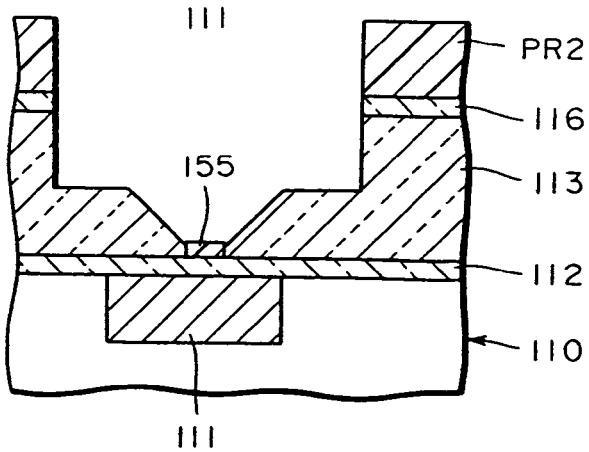
Figure 16D:
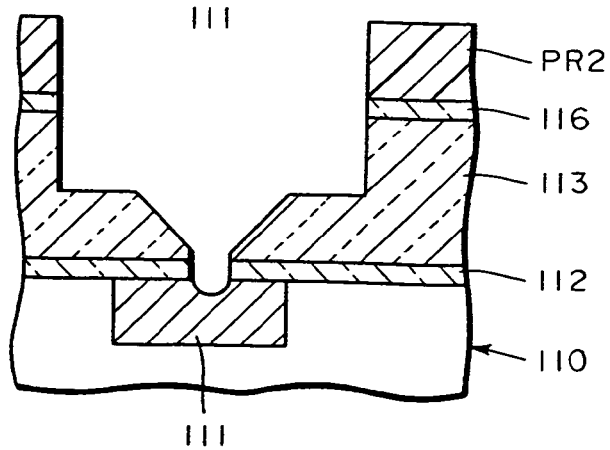

The examples shown in FIGS. 14D, 15D and 16D show the states that the wiring trenches having a depth of 800 nm were formed through etching. In the example shown in FIG. 16D, the etch stopper 112 is etched and even the underlying conductive region 111 is etched. A dual damascene wiring structure formed in such a state does not guarantee the wiring electrical characteristics and the conductive wires have low reliability.

In the example shown in FIG. 14D, although the filler 155 is left sufficiently, the surface of the filler 155 is etched and protrudes higher than the etched surface of the shoulder. There is therefore abnormal etching.

In the example shown in FIG. 15D, the etched shoulder region reaches the surface of the filler 155, which state may form etching residue. Although abnormal etching does not occur presently, it may occur sooner or later.

Quantitative studies are given. As shown in FIGS. 14A and 14C, a thickness of the interlayer insulating film 113 is represented by h, a height of the filler 155 is represented by z, a depth of the wiring trench is represented by y, a deepest depth of the via hole shoulder is represented by x, and a remaining height of the filler 155 is represented by z'. An etching amount of the filler is Δz=z−z'. An etch ratio of the interlayer insulating film to the filler is represented by b.

The etching amount of the filler can be represented by Δz=y/b. Therefore, z'=z−Δz=z−(y/b). Assuming that the etch depth of the shoulder x is x={1+(1/1.4)}y, the conditions of forming no etching residue are represented by:

$$h-x=h-\{1+(1/1.4)\}y>z'=z-(y/b)$$

The height of the filler necessary for protecting the bottom of the via hole is z>(y/b). If the etching depth y is made larger, the value z is required to be set large. As the value z becomes large, etching residue is likely to be formed.

In the controlled etching that an etch stopper is not formed in the interlayer insulating film, the deeper the etching depth of the wiring trench, the more easily the abnormal etching occurs. If the height of the filler is made lower, although abnormal etching does not occur, the etch stopper layer may be damaged so that there is a higher danger that the underlying conductive region is damaged. The problem arises when the deep wiring trench is formed in order to form a thick wiring layer.

In the examples shown in FIGS. 14A to 14D, FIGS. 15A to 15D and FIGS. 16A to 16D, although there is no problem at an etching depth to 400 nm, good results are impossible at the etching depth of 800 nm. Generally, there arises a problem when a wiring layer having a depth of 500 nm or deeper is formed.

Embodiments of the invention will be described with reference to the accompanying drawings.

Figure 1A:
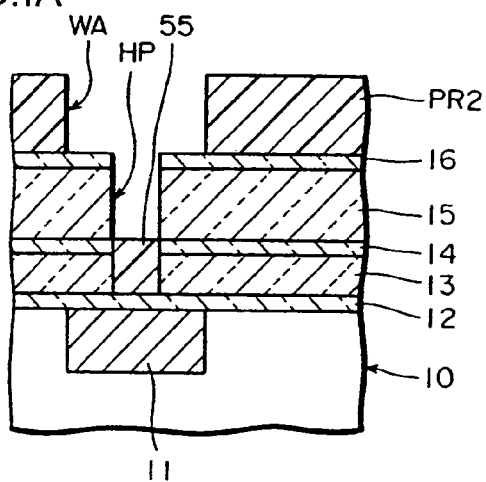
FIGS. 1A to 1F are cross sectional views of a semiconductor substrate used for explaining an embodiment of the invention.

As shown in FIG. 1A, on an underlie 10 having a conductive region 11, a laminated structure is formed. The laminated structure has: a first etch stopper layer 12 made of SiN or the like; a first interlayer insulating film 13 made of fluorine containing silicon oxide (FSG) or the like; a second etch stopper layer 14 made of silicon nitride (SiN) or the like; a second interlayer insulating film 15 formed of fluorine containing silicon oxide; and an insulating antireflection film 16 made of SiN or the like.

FSG has a dielectric constant lower than usual silicon oxide. The dielectric constant may be variably controlled by the content of fluorine, etc. Silicon nitride can have an etch rate very lower than that of silicon oxide, and can be used as an etch stopper. However, the dielectric constant of silicon nitride is higher than that of silicon oxide.

The laminated structure may be formed by chemical vapor deposition (CVD). The first and second etch stopper layers 12 and 14 are made of, for example, SiN. The first interlayer insulating film 13 is made of, for example, fluorine containing silicon oxide. The second interlayer insulating film 15 is made of, for example, fluorine containing silicon oxide thicker than the first interlayer insulating film 13. The antireflection film 16 is made of, for example, SiN.

Figure 12A:
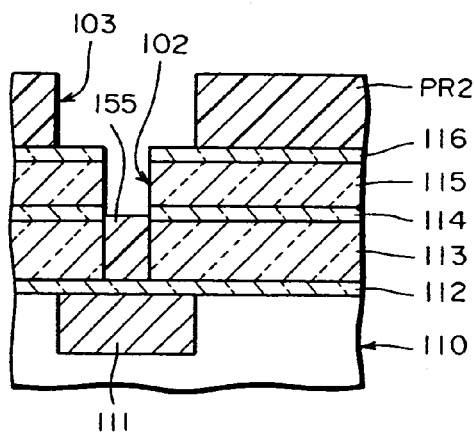
FIGS. 12A to 12E are cross sectional views of a semiconductor device illustrating another semiconductor device manufacture method according to conventional techniques.
Figure 12D:
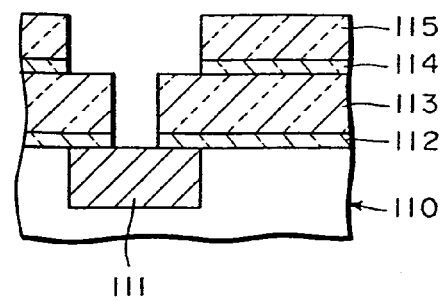
Figure 12B:
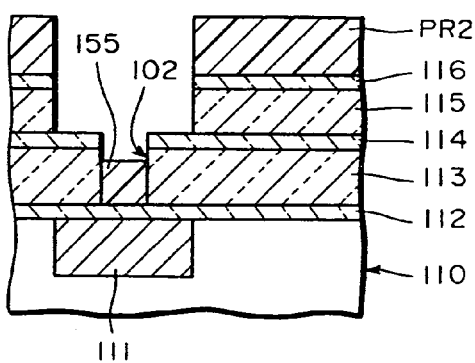
Figure 12E:
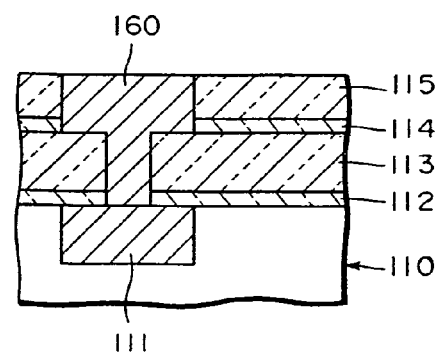
Figure 12C:
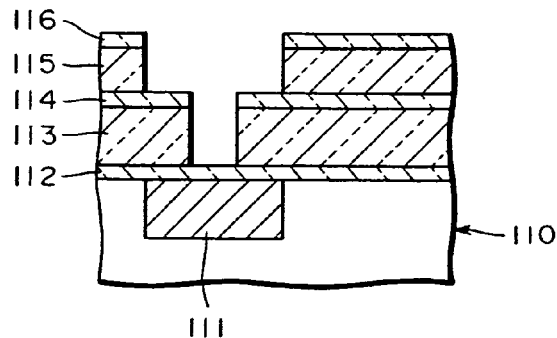

The laminated structure is similar to that shown in FIG. 12A. As compared to that shown in FIG. 12A, the second etch stopper layer 14 is disposed nearer to the underlie 10. Namely, the first interlayer insulating film 13 is made thinner and the second interlayer insulating film 15 is made thicker. A wiring trench is formed in the upper region of the second interlayer insulating film 15 through controlled etching.

After a resist pattern is formed on the antireflection film 16, a via hole HP reaching the first etch stopper 12 is formed. The resist pattern is thereafter removed, and a protective filler 55 of organic substance is disposed on the bottom of the via hole HP. For example, the protective filler 55 is made of resist whose photosensitive material components were removed. The height of the filler 55 can be selectively set by controlling the time taken to remove the filler with developing liquid. It is preferable to set the upper surface of the filler 55 lower than the upper surface of the second etch stopper layer 14.

On the antireflection film 16, a resist pattern PR2 is formed having an opening WA corresponding to the shape of a wiring trench.

Figure 1B:
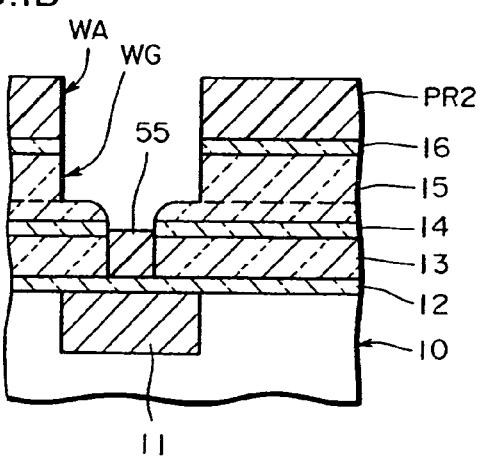

As shown in FIG. 1B, by using the resist pattern PR2 having the opening WA, the antireflection film 16 is etched and thereafter controlled etching of the second interlayer insulating film 15 is performed. For example, mixture of CF containing gas and $O_2$ containing gas is used as etchant gas.

The etching depth is set to an intermediate level of the second interlayer insulating film 15. A wiring trench or groove WG is therefore formed in the second interlayer insulating film 15. The side wall and bottom of the wiring trench WG are defined by the second interlayer insulating film 15 having a lower dielectric constant, and the second etch stopper layer 14 is disposed lower than the bottom of the wiring trench.

The second etch stopper 14 does not function as an etch stopper layer when the main portion of the wiring trench is formed through etching. However, the second etch stopper 14 surrounds the upper periphery of the filler 55 in the via hole HP so that it suppresses the shoulder from being etched to thereby prevent abnormal etching. Namely, the etching depth x of the shoulder shown in FIG. 14C is restricted. In this limited context, the second etch stopper layer 14 functions as an etch stopper.

Figure 1C:
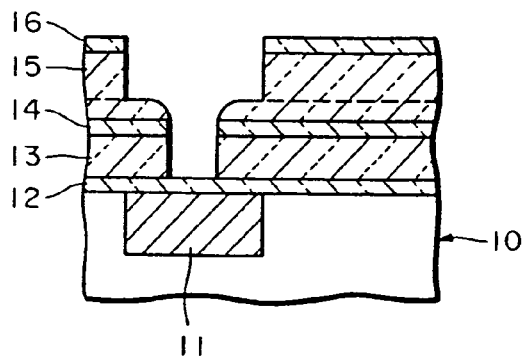

As shown in FIG. 1C, after the wiring trench is formed through etching, ashing is performed to remove the resist pattern PR2 and organic protective filler 55.

Figure 1D:
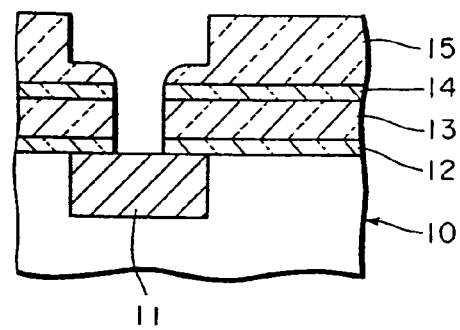

As shown in FIG. 1D, silicon nitride of the antireflection film 16 and first etch stopper layer 12 is etched by using, for example, etching gas of $CHF_3+O_2$.

Figure 1E:
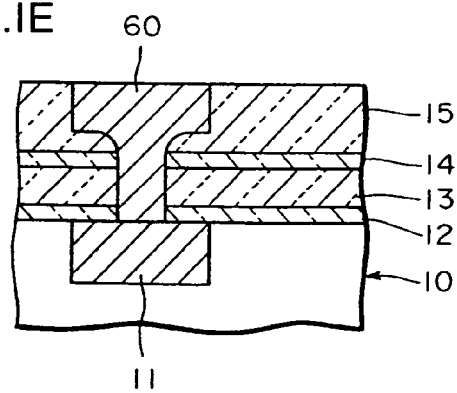

As shown in FIG. 1E, a dual damascene wiring layer 60 is formed in the wiring trench and in the via hole. For example, the dual damascene wiring layer 60 is formed by sputtering TaN to form a barrier layer and thereafter forming a Cu seed layer and a Cu main wiring layer. The Cu layer may be formed, for example, by plating. The barrier layer, seed layer and main wiring layer deposited on the upper surface of the second interlayer insulating film 15 are removed by CMP or the like.

In this embodiment, the upper surface of the filler 55 is set lower than the upper surface of the second etching stopper layer 14. Abnormal etching of the peripheral region of the via hole can therefore be suppressed while the wiring trench is formed through etching. Therefore, the shape of the via hole continuous with the wiring trench becomes smooth so that the barrier layer is reliably adhered to the inner surfaces of the wiring trench and via hole. The seed layer and main wiring layer can be formed thereafter reliably.

Although the second etch stopper layer 14 has a relatively high dielectric constant, it is positioned lower than the main wiring layer. An increase in the wiring capacitance can therefore be suppressed. The via hole occupies only a small area in the substrate plane. Parasitic capacitance is less influenced than the case that the second etch stopper layer contacts the side wall of the wiring trench.

During the process of etching the first etch stopper layer 12 shown in FIG. 1D, the second interlayer insulating film is etched in some cases.

Figure 1F:
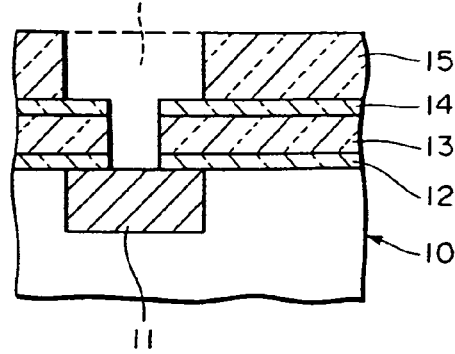

FIG. 1F shows the second etch stopper layer 14 exposed because the second interlayer insulating film 15 on the bottom of the wiring trench is etched by the process of etching the first etch stopper layer 12 shown in FIG. 1D. As the second etch stopper layer 14 is exposed, parasitic capacitance of the wiring layer increases slightly. However, the surface of the conductive region 11 is prevented from being damaged and abnormal etching is prevented, these advantageous effects being retained.

A supplemental description will be given relative to a preferred height of the second etch stopper layer 14. It is assumed that the thickness of the interlayer insulating film excluding the second etch stopper layer 14 is, for example, 1500 nm. A wiring trench having a depth of 800 nm is formed in this interlayer insulating film. The height of the protective filler is assumed to be 600 nm.

Figure 17A:
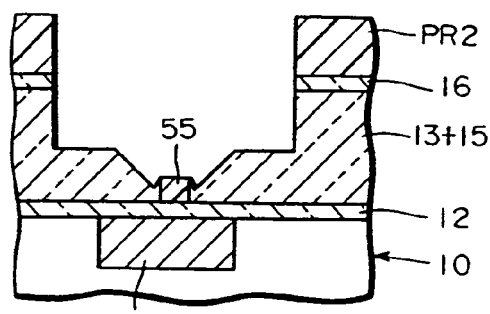
FIGS. 17AA to 17AD and FIGS. 17BA to 17BD are cross sectional views of a semiconductor substrate illustrating analysis on how abnormal etching occurs and underlie damages are formed according to conventional techniques.

FIG. 17AA is a schematic cross sectional view of a substrate having a wiring trench of 800 nm in depth formed without using the second etch stopper layer 14. The shoulder near the via hole is fairly etched and abnormal etching occurs in the area around the filler 55.

Figure 17B:
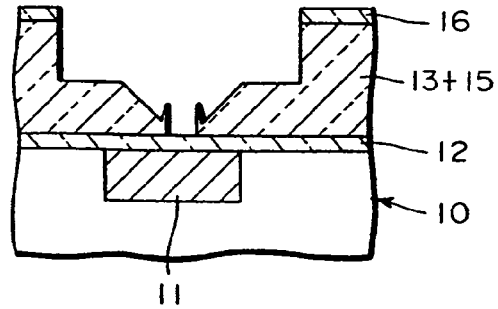
Figure 17A:
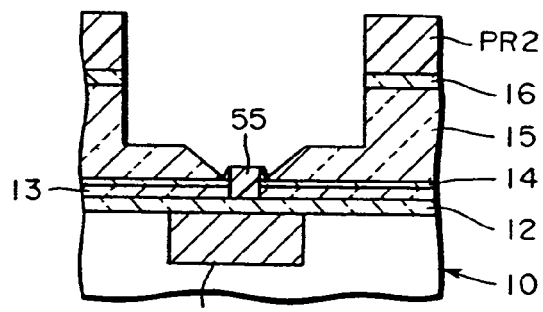
Figure 17B:
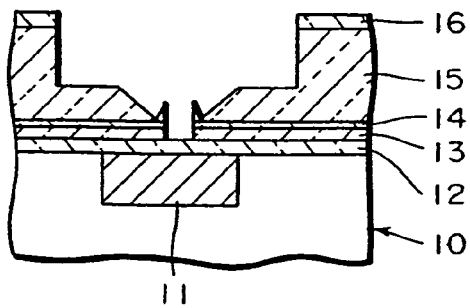
Figure 17A:
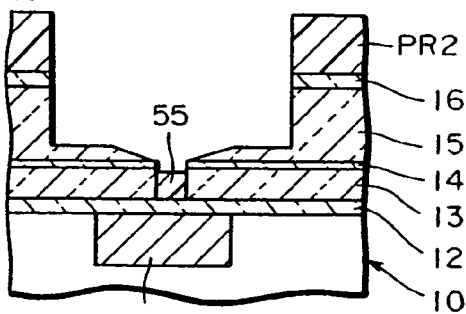
Figure 17B:
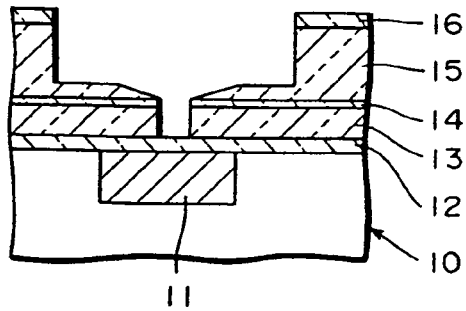
Figure 17A:
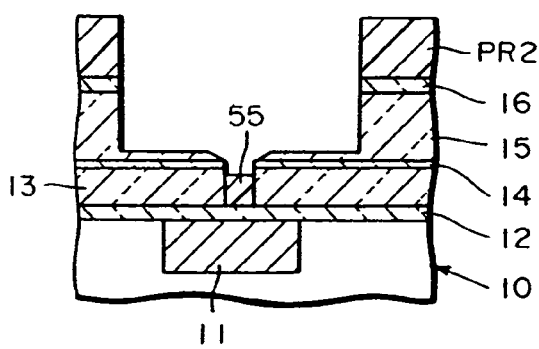
Figure 17B:
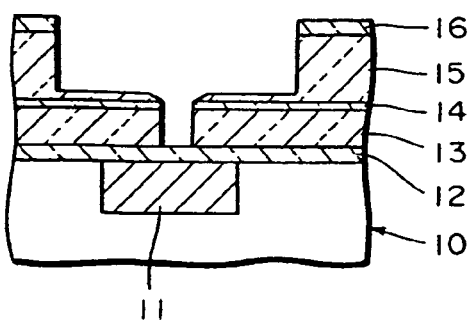

FIG. 17BA shows the state that the resist pattern PR2 and filler 55 were removed. The interlayer insulating film has a sharp projection and a deep cut near the via hole. It is difficult to form a dual damascene wiring layer.

FIG. 17AB shows the state that the etch stopper layer is disposed at a height of 200 nm from the bottom of the interlayer insulating film. Also in this case, the shoulder near the via hole is fairly etched, the upper surface of the filler 55 projects higher than the etched surface of the interlayer insulating film, and abnormal etching occurs in the nearby area.

FIG. 17BB shows the state that the resist pattern PR2 and filler 55 were removed. The interlayer insulating film has a sharp projection and a deep cut near the via hole.

FIGS. 17AC and 17BC show the state that the second etch stopper layer 14 is disposed at a height of 400 nm from the bottom of the interlayer insulating film. Etching the shoulder is stopped by the second etch stopper layer 14 and the filler 55 is left in the lower area of the via hole.

As shown in FIG. 17BC, after the resist pattern PR2 was removed, a dual damascene wiring trench is therefore formed having the shoulder gently sloping near the via hole.

FIGS. 17AD and 17BD show the state that the second etch stopper layer 14 is disposed at a height of 600 nm from the bottom of the interlayer insulating film. The shoulder is fairly etched near the via hole, and after the second etch stopper 14 is exposed, etching the shoulder hardly progresses further.

As shown in FIG. 17BD, after the resist pattern PR2 was removed, a wiring trench having a generally flat surface and a via hole without abnormal etching in the nearby area can therefore be formed. As described above, abnormal etching can be effectively prevented and a good topology can be obtained by setting the upper surface of the filler lower than the lowest level of the shoulder when the etch stopper layer is exposed after etching the shoulder progresses near the via hole.

In the embodiment shown in FIGS. 1A to 1E, the interlayer insulating film has the three-layer lamination structure. The structure of the interlayer insulating film may be simplified more.

FIGS. 2A to 2E show an embodiment wherein the interlayer insulating film has a two-layer lamination structure.

Figure 2A:
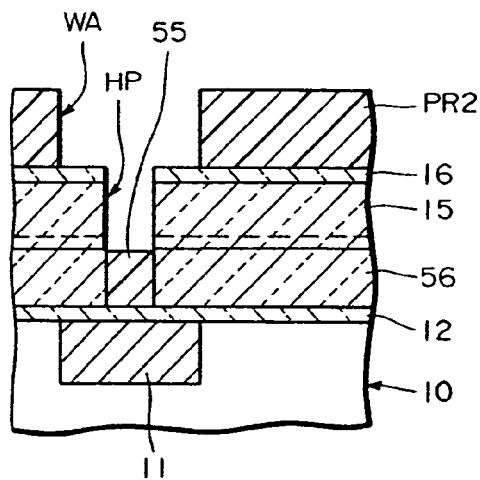
FIGS. 2A to 2F are cross sectional views of a semiconductor substrate used for explaining another embodiment of the invention.

As shown in FIG. 2A, on an underlie 10 having a conductive region 11, a lamination structure is formed having an etch stopper layer 12, a first interlayer insulating film 56 made of plasma $SiO_2$ or the like, a second interlayer insulating film 15 made of fluorine containing silicon oxide or the like, and an antireflection film 16 made of SiN or the like.

The first and second interlayer insulating films 56 and 15 have similar etch rates, the first interlayer insulating film having a lower etch rate and the second interlayer insulating film having a higher etch rate.

The thickness of the second interlayer insulating film 15 is set thicker than the depth of a wiring trench to be formed later. Since the second etch stopper does not exist, it is preferable to form the first interlayer insulating film 56 thicker. For example, the first interlayer insulating film 56 is made thicker than the second interlayer insulating film.

Similar to the embodiment shown in FIGS. 1A to 1E, after a resist pattern is formed on the antireflection film 16, the antireflection film 16, second and first interlayer insulating films 15 and 56 are anisotropically etched to form a via hole HP. The resist pattern is thereafter removed, and a protective filler 55 of organic compound is disposed on the bottom of the via hole HP. Similar to the first embodiment, the protective filler 55 is formed lower than the upper surface of the first interlayer insulating film 56. The first and second interlayer insulating films 56 and 15 have similar etch rates, as described above.

A resist pattern PR2 having an opening WA corresponding to a wiring trench pattern is formed on the antireflection film 16.

Figure 2B:
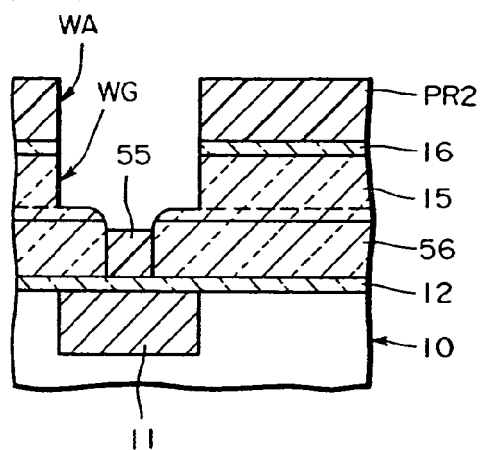

As shown in FIG. 2B, by using the resist pattern PR2 having the opening WA, the antireflection film 16 and second interlayer insulating film 15 are etched. The second interlayer insulating film 15 is etched through controlled etching to control the etched depth by time. Etching is stopped under the conditions that some thickness of the second interlayer insulating film 15 is left unetched. In this manner, a wiring trench WG is formed in the second interlayer insulating film 15.

The protective filler 55 is surrounded with the first interlayer insulating film 56 having the etch rate lower than the second interlayer insulating film 15. There is, therefore, only a small possibility that abnormal etching occurs in the nearby area of the protective filler 55 while the wiring trench is formed through etching.

Figure 2C:
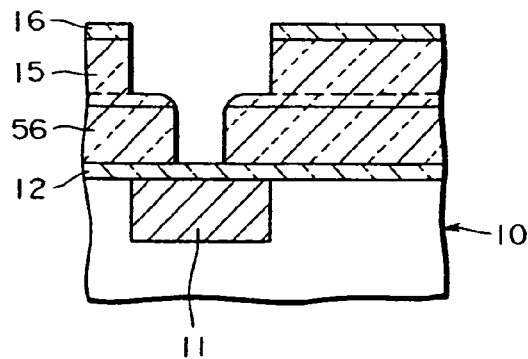

As shown in FIG. 2C, the resist pattern PR2 and protective filler 55 are removed by ashing.

Figure 2D:
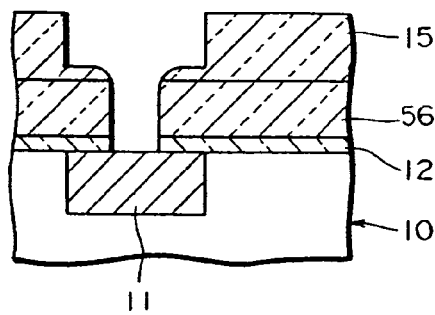

As shown in FIG. 2D, the antireflection film 16 on the upper surface of the second interlayer insulating film 15 and the etch stopper layer 12 of SiN on the bottom of the via hole are etched and removed.

Figure 2E:
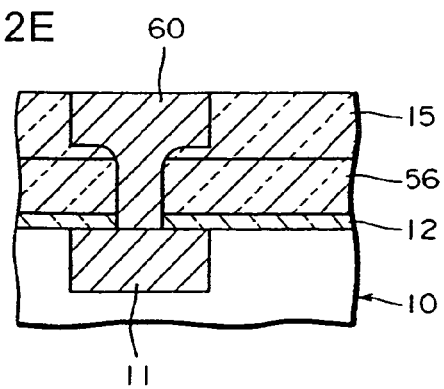

As shown in FIG. 2E, a dual damascene wiring layer 60 is formed in the wiring trench and in the via hole. These processes are similar to those of the first embodiment.

How the thicknesses of the first and second interlayer insulating films 56 and 15 of the embodiment shown in FIGS. 2A to 2E is selected, will be described specifically. It is assumed that a total thickness of the first and second interlayer insulating films is 1500 nm, the depth of the wiring trench is 800 nm, and the height of the protective filler in the via hole is about 500 nm.

Figure 18A:
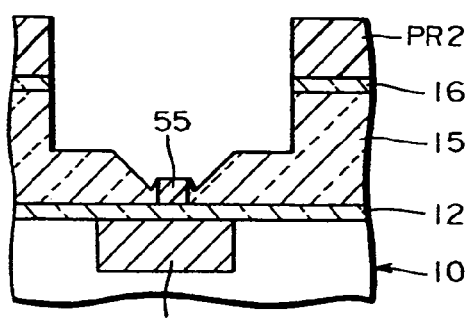
FIGS. 18AA to 18AD and FIGS. 18BA to 18BD are cross sectional views of a semiconductor substrate illustrating analysis on how abnormal etching occurs and underlie damages are formed according to conventional techniques.
Figure 18B:
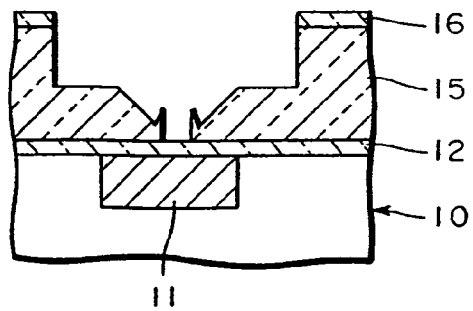
Figure 18A:
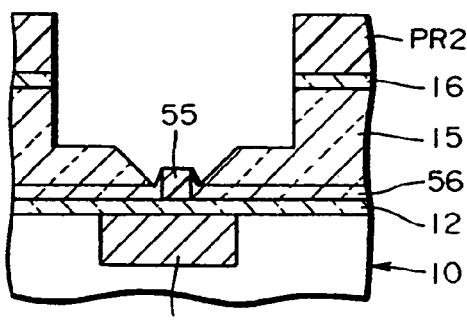
Figure 18B:
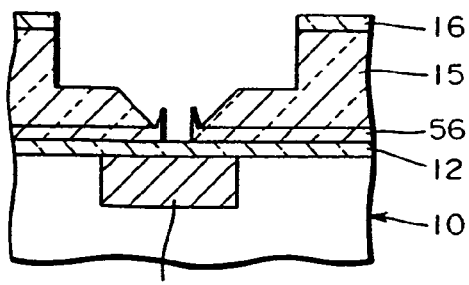
Figure 18A:
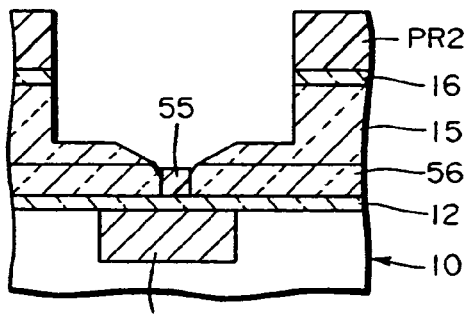
Figure 18B:
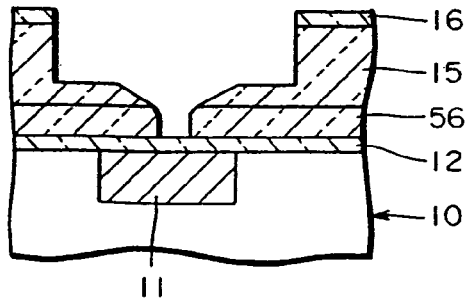
Figure 18A:
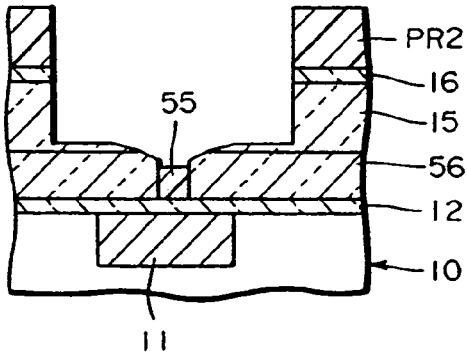
Figure 18B:
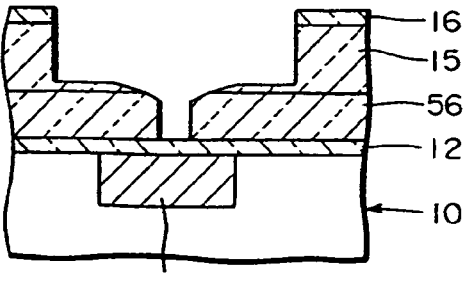

FIGS. 18AA and 18BA show the substrate having a single interlayer insulating film 15. In this case, etching fairly progresses near the via hole, and abnormal etching occurs in the nearby area of the filler 55. As shown in FIG. 18BA, after the resist pattern PR and filler 55 were removed, the interlayer insulating film has a sharp projection and a deep cut near the via hole.

FIGS. 18AB and 18BB show the case that a lower first interlayer insulating film 56 has a thickness of about 200 nm (a second interlayer insulating film 15 has a thickness of 1300 nm). In this case, abnormal etching stops when the first interlayer insulating film 56 is exposed.

FIG. 18AC shows the case that the first interlayer insulating film 56 has a thickness of about 400 nm. As the shoulder near the via hole is etched and after the first interlayer insulating film 56 is exposed, etching the shoulder progresses gently. As shown in FIG. 18BC, after the resist pattern PR2 and filler 55 were removed after the etching stopped, a via hole is therefore obtained which has a main part constituted of a generally vertical side wall on the side of the first interlayer insulating film 56 and an upper part constituted of a gently sloped shoulder.

FIGS. 18AD and 18BD show the case that the first interlayer insulating film 56 has a thickness of about 600 nm. In this case, the first interlayer insulating film 56 exposes at a timing earlier than that shown in FIG. 18AC, and thereafter etching the first interlayer insulating film 56 progresses slowly so that the etching amount of the shoulder becomes small. As shown in FIG. 18BD, after the resist pattern PR2 and filler 55 were removed, a dual damascene wiring trench is therefore obtained which has a main part constituted of a generally vertical side wall and a gently sloped upper shoulder.

A good etched topology can therefore be obtained by setting the upper surface of the filler 55 lower than the upper surface of the etching suppressing layer.

In this embodiment, the second etch stopper layer made of high dielectric constant material such as SiN is not used. A wiring capacitance can be reduced and an increase in the capacitance of the via hole can be suppressed.

Figure 2F:
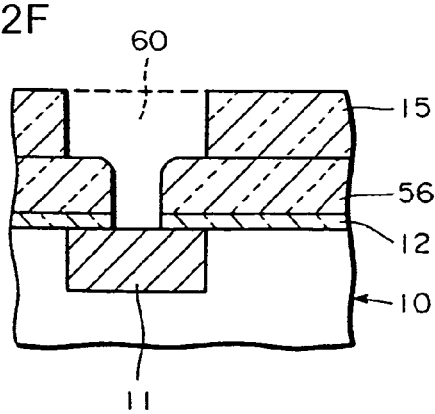

FIG. 2F shows the first interlayer insulating film 56 which is exposed when the second interlayer insulating film 15 on the bottom of the wiring trench is etched by the etching process for the first etch stopper layer 12 shown in FIG. 2D. The wiring trench enters further into the first interlayer insulating film under some conditions. As the first interlayer insulating film 56 is exposed, wiring parasitic capacitance increases slightly. However, surface damages of the conductive region 11 can be suppressed and abnormal etching can be prevented.

In the second embodiment, the lower interlayer insulting film is made of plasma $SiO_2$. A plasma $SiO_2$ film has a low etch rate but its dielectric constant is not so low although it is lower than SiN. In order to further reduce the capacitance between upper and lower wiring layers, it is desired to use material having a much lower dielectric constant.

FIGS. 3A to 3E show the structure of an interlayer insulating film made of a plasma $SiO_2$ film capable of suppressing abnormal etching having a limited thickness and sandwiched between fluorine containing silicon oxide films.

Figure 3A:
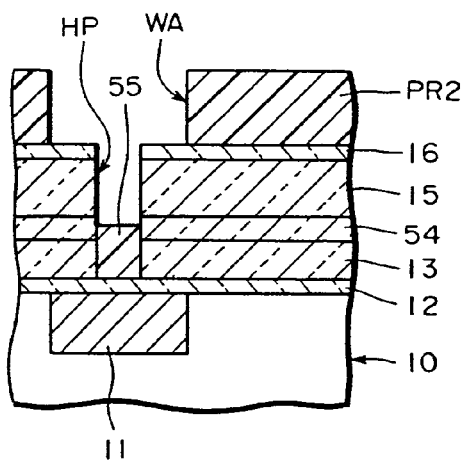
FIGS. 3A to 3F are cross sectional views of a semiconductor substrate used for explaining still another embodiment of the invention.

As shown in FIG. 3A, on an underlie 10 having a conductive region 11, a lamination structure is formed having: an etch stopper layer 12 made of SiN or the like; a first interlayer insulating film 13 made of fluorine containing silicon oxide; an etch suppressing insulating film 54 made of plasma $SiO_2$; a second interlayer insulating film 15 made of fluorine containing silicon oxide; and an antireflection film 16 made of SiN or the like.

The first and second interlayer insulating films 13 and 15 and etching suppressing insulating film 54 have similar etch rates to that of the filler. The first and second interlayer insulating films 13 and 15 have a higher etch rate, whereas the etching suppressing insulating film 54 has a lower etch rate.

The structure shown in FIG. 3A corresponds to the structure that the first interlayer insulating film 56 shown in FIG. 2A is replaced by the lamination structure of the first interlayer insulating film 13 and etching suppressing insulating film 54.

After a resist pattern is formed on the antireflection film 16, a via hole HP is formed. The resist pattern is removed and thereafter a protective filler 55 of organic compound is formed on the bottom of the via hole HP. The upper surface of the protective filler 55 is lower than the upper surface of the etching suppressing insulating film 54, and the protective filler 55 is surrounded with the etching suppressing insulating film 54.

A resist pattern PR2 having a wiring trench forming opening WA is formed on the surface of the antireflection film 16.

Figure 3B:
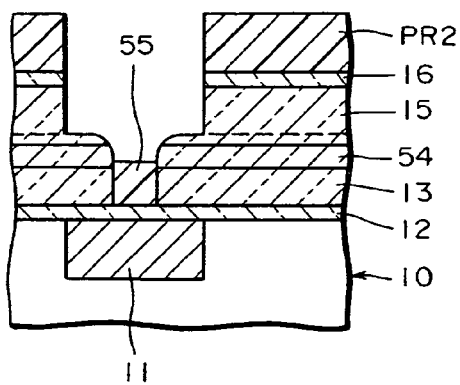

As shown in FIG. 3B, by using the resist pattern PR2 as a mask, the antireflection film 16 is etched and then the second interlayer insulating film 15 is etched through controlled etching. The controlled etching of the second interlayer insulating film 15 leaves some thickness of this film.

In this case, although etching the shoulder near the via hole progresses, since there is the underlying insulating film 54 having the lower etch rate, etching near the protective filler 55 can be suppressed.

Figure 3C:
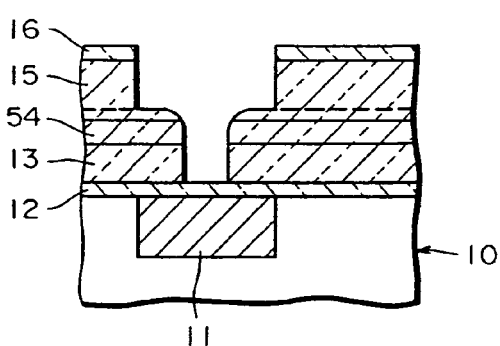

As shown in FIG. 3C, the resist pattern PR2 and protective filler 55 are removed by ashing.

Figure 3D:
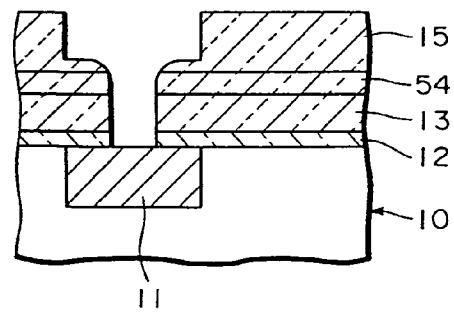

As shown in FIG. 3D, the antireflection film 16 on the surface of the second interlayer insulating film 15 and the etch stopper layer 12 on the bottom of the via hole are etched and removed. In this manner, a wiring trench and via hole can be formed while abnormal etching is suppressed.

Figure 3E:
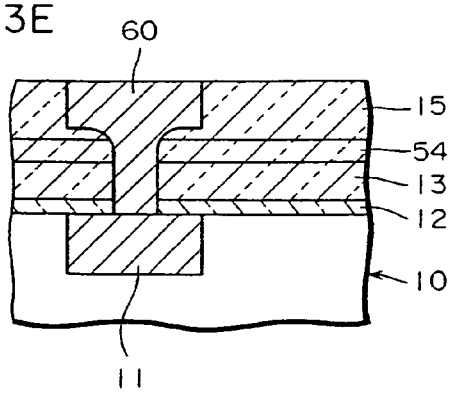

As shown in FIG. 3E, a dual damascene wiring layer 60 is formed in the wiring trench and in the via hole. This process is similar to that of the above-described embodiments.

Figure 3F:
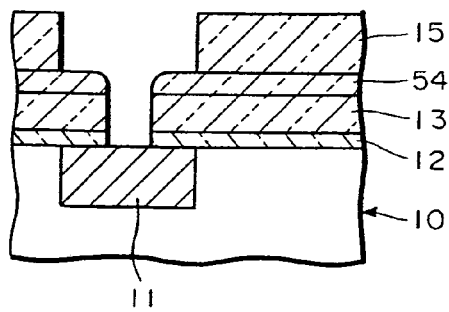

FIG. 3F shows the case where the etching suppressing insulating film 54 is exposed when the second interlayer insulating film 15 on the bottom of the wiring trench is etched by the etching process for the first etch stopper layer 12 shown in FIG. 3D. The wiring trench may enter further into the etching suppressing insulating film under some conditions. As the etching suppressing insulating film 54 is exposed, wiring parasitic capacitance increases slightly. However, surface damages of the conductive region 11 can be suppressed and abnormal etching can be prevented.

In this embodiment, in order to prevent surface damages of the underlying conductive region, the filler is formed on the bottom of the via hole. Another embodiment will be described in which the surface of a conductive region under the via hole is prevented from being damaged without using a filler.

FIGS. 4A to 4H are cross sectional views illustrating a method of manufacturing a semiconductor device according to another embodiment of the invention.

Figure 4A:
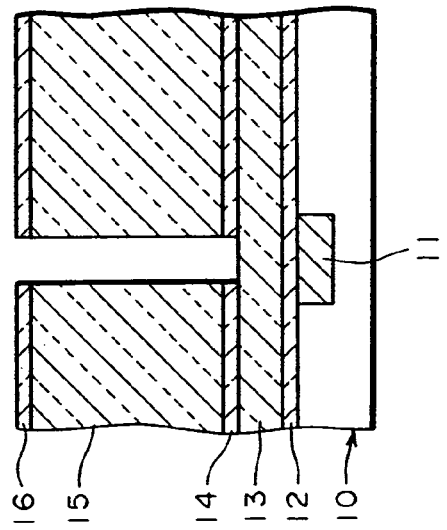
FIGS. 4A to 4H are cross sectional views of a semiconductor substrate used for explaining still another embodiment of the invention.

As shown in FIG. 4A, on the surface of an underlie 10 having a conductive region 11 such as a copper wire, a lamination structure is formed which has a first etch stopper layer 12, a first interlayer insulating film 13, a second etch stopper layer 14, a second interlayer insulating film 15 and an antireflection film 16. This lamination structure can be formed by chemical vapor deposition (CVD).

The first and second etch stopper layers 12 and 14 are made of, for example, an SiN film having a thickness of about 50 nm. The first interlayer insulating film 13 is made of, for example, a fluorine containing silicon oxide film having a thickness of 300 nm. The second interlayer insulating film 15 is made of, for example, a fluorine containing silicon oxide film having a thickness of 900 nm thicker than the first interlayer insulating film 13. The antireflection film 16 is made of, for example, an SiN film having a thickness of 50 nm. Resist is coated on the surface of the antireflection film 16, and exposed and developed to form a resist pattern PR1 having a via hole opening HA.

Figure 4B:
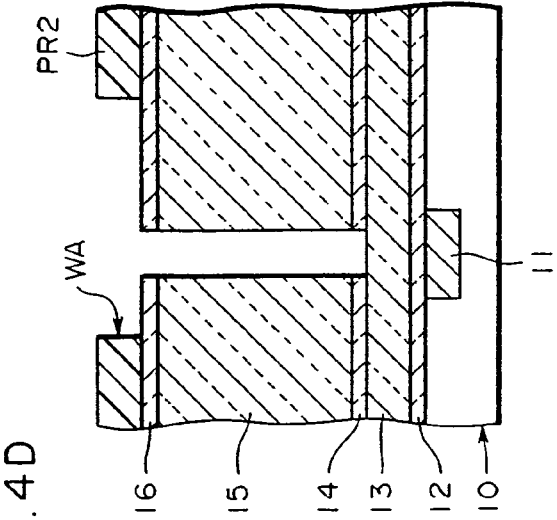

As shown in FIG. 4B, by using the resist pattern PR1 as an etching mask, the antireflection film 16, second interlayer insulating film 15 and second etch stopper layer 14 are etched. For this etching, fluorine containing gas is used as etchant for the SiN films 16 and 14, and mixture gas of CF containing gas and $O_2$ containing gas is used as etchant for the second interlayer insulating film made of fluorine containing silicon oxide. With this etching process, the first interlayer insulating film 13 is exposed on the bottom of the via hole HP.

Figure 4C:
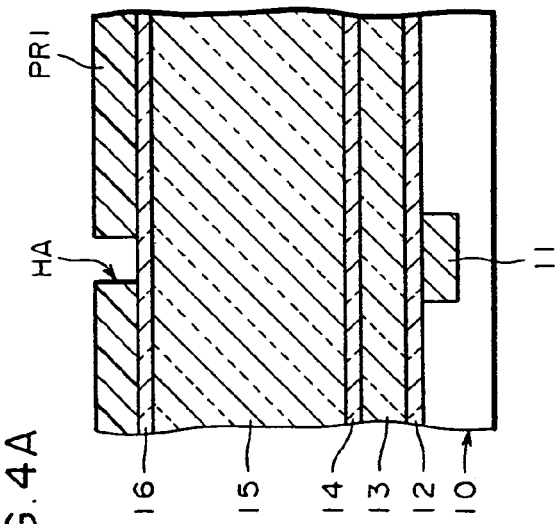

As shown in FIG. 4C, the resist pattern PR1 is removed by ashing. During the processes shown in FIGS. 4B and 4C, the underlying conductive layer 11 is not damaged by etching and ashing because it is covered with the first etch stopper layer 12 and first interlayer insulating film 13.

Figure 4D:
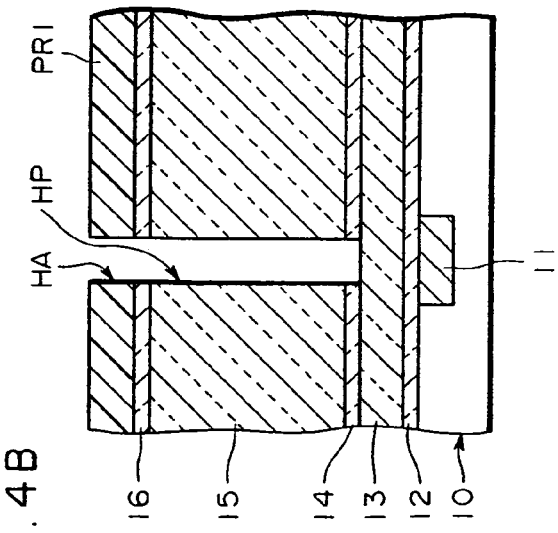

As shown in FIG. 4D, resist is coated on the antireflection film 16, and exposed and developed to form a resist pattern PR2 having a wiring trench opening WA.

Figure 4E:
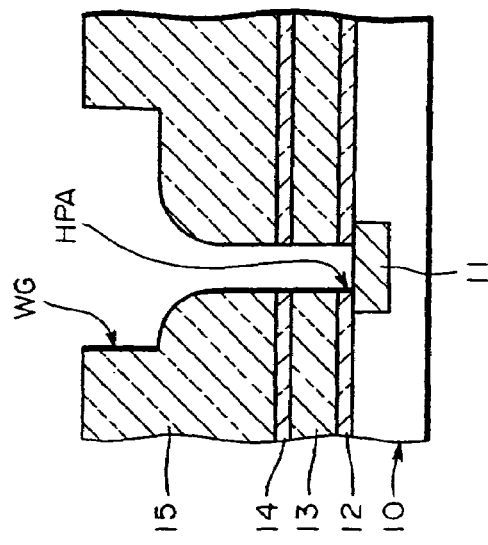

As shown in FIG. 4E, by using the resist pattern PR2 as an etching mask, the antireflection film 16 is etched and then the second interlayer insulating film 15 is etched through controlled etching. An etched depth d1 of the second interlayer insulating film 15 is set greater than a thickness d2 of the first interlayer insulating film 13.

With this setting, while the wiring trench WG is formed through etching, the first interlayer insulating film 13 under the via hole is completely etched so that the first etch stopper layer 12 is exposed. Since the etch rate of the first etch stopper layer 12 can be set sufficiently lower than that of the second interlayer insulating film 15, a sufficient thickness of the first etch stopper is left unetched by the etching for the wiring trench. The underlying conductive region can therefore be prevented from any damage.

Figure 4G:
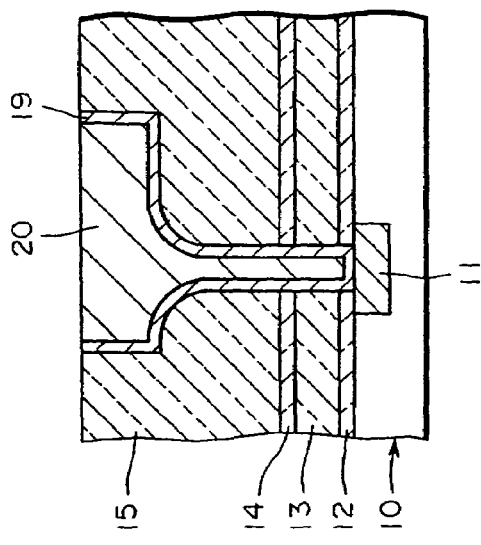
Figure 4F:
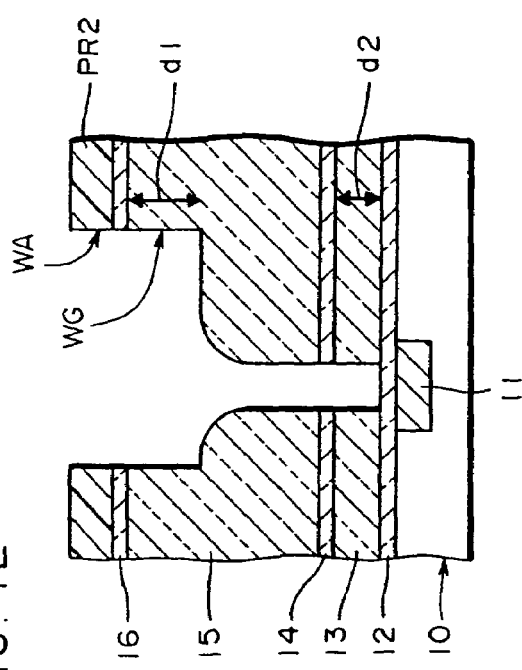

As shown in FIG. 4F, the resist pattern PR2 is removed by ashing. Also during this ashing, the surface of the conductive region 11 of the underlie 10 is covered with the first etch stopper layer 12 so that the conductive region can be prevented from being damaged by ashing.

As shown in FIG. 4G, the antireflection film 16 on the surface of the second interlayer insulating film 15 and the first etch stopper layer 12 exposed in the via hole are etched and removed. After the first etch stopper layer 12 was removed, a via hole HPA exposing the conductive region 11 is therefore formed.

Figure 4H:
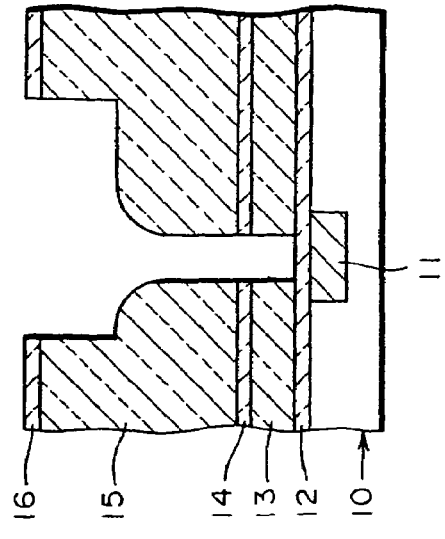

As shown in FIG. 4H, a barrier layer 19 and a main wiring layer 20 are embedded in the wiring trench WG and in the via hole HPA to form a dual damascene wiring layer. The barrier layer and main wiring layer deposited on the upper surface of the second interlayer insulating film 15 are removed by CMP or the like. The main wiring layer 20 is made of a laminated layer of, for example, a sputtered seed Cu layer and a plated Cu layer.

In this embodiment, the via hole HP formed as shown in FIG. 4B does not reach the first etch stopper layer 12 covering the surface of the conductive region 11, but stops at the surface of the first interlayer insulating film 13 on the first etch stopper layer 12. Therefore, during the later etching process for the wiring trench, a sufficient thickness of the first etch stopper layer 12 is left unetched so that the conductive region can easily be prevented from being damaged.

The thickness of the first interlayer insulating film 13 is set so that this film can be etched completely by the wiring trench forming etching process. For example, the depth d1 of the wiring trench WG in the second interlayer insulating film is set to 500 nm and the thickness d2 of the first interlayer insulating film 13 is set to 300 nm.

During the etching process for forming the wiring trench WG in the second interlayer insulating film, when the first interlayer insulating film 13 having a thickness of 300 nm is etched completely, a wiring trench WG has a depth of about 300 nm. During the process of etching the remaining thickness of 200 nm, the first etch stopper layer 12 is etched by 200/12=16.6 nm if the etch rate ratio between the interlayer insulating films 13 and 15 and the first etch stopper layer 12 is set to 12:1. Since the first etch stopper layer 12 has a thickness of about 50 nm, a sufficient thickness of the first etch stopper layer 12 can be left and the conductive layer can be easily prevented from being damaged.

Since a filler is not formed in the via hole HP, abnormal etching will not occur in the nearby area of the via hole during the etching process for the wiring trench.

In the embodiment shown in FIGS. 4A to 4H, the etch stopper layer is disposed in the interlayer insulating film. The etch stopper layer is not necessarily required to obtain similar effects.

FIGS. 5A to 5D are cross sectional views illustrating a method of manufacturing a semiconductor device according to another embodiment of the invention.

Figure 5C:
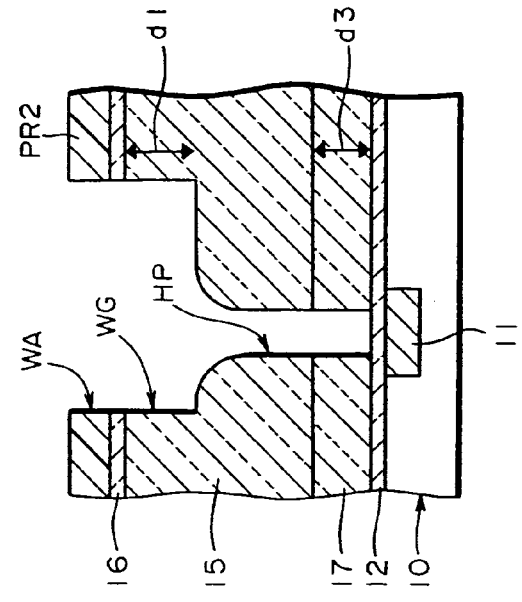
FIGS. 5A to 5D are cross sectional views of a semiconductor substrate used for explaining still another embodiment of the invention.
Figure 5D:
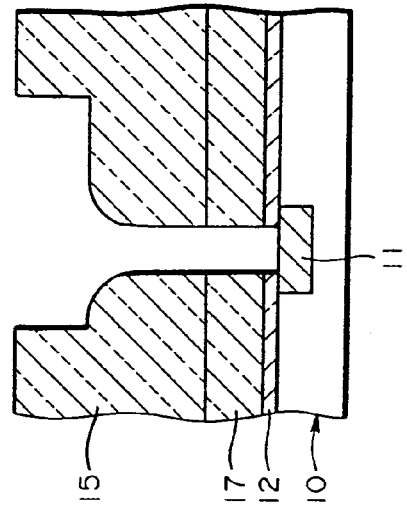
Figure 5A:
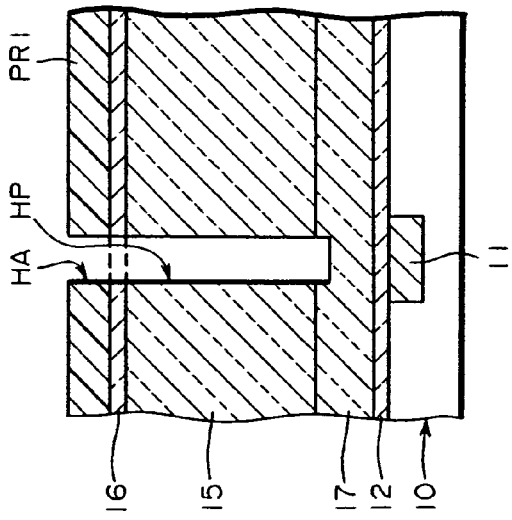

As shown in FIG. 5A, after a first etch stopper layer 12 is formed on the surface of an underlie 10, a plasma $SiO_2$ film 17 is deposited to a thickness of about 200 nm. On this plasma $SiO_2$ film 17, a second interlayer insulating film 15 made of fluorine containing silicon oxide is deposited to a thickness of about 1000 nm. An antireflection film 16 is formed on the second interlayer insulating film 15 to a thickness of about 50 nm.

This structure corresponds to the structure that the lamination of the first interlayer insulating films 13 and second etch stopper layer 14 shown in FIG. 4A is replaced by the first interlayer insulating film 17 made of plasma $SiO_2$.

A resist pattern PR1 having a via hole opening HA is formed on the antireflection film 16 and thereafter the antireflection film 16 and second interlayer insulating film 15 are etched. During this etching process, the surface of the first interlayer insulating film 17 is over-etched slightly because there is no etch stopper layer.

This over-etch amount can be reduced by setting the etch rate of the first interlayer insulating film lower than that of the second interlayer insulating film. For example, if mixture gas of CF containing gas and $O_2$ containing gas is used as etchant, the etch rate ratio between the second interlayer insulating film 15 and the first interlayer insulating film 17 may be set to 2:1.

If the second interlayer insulating film 15 is over-etched by an amount corresponding to about 150 nm, the surface of the first interlayer insulating film 17 is over-etched by about 75 nm. In this case, a thickness of about 125 nm of the first interlayer insulating film 17 is left. Therefore, the first etch stopper layer 12 is etched not at all, and the underlying conductive region 11 is perfectly prevented from being damaged.

After the via hole HP is formed, the resist pattern PR1 is removed by ashing. Also in this ashing process, the conductive region 11 in the underlie 10 is perfectly prevented from being damaged.

Figure 5B:
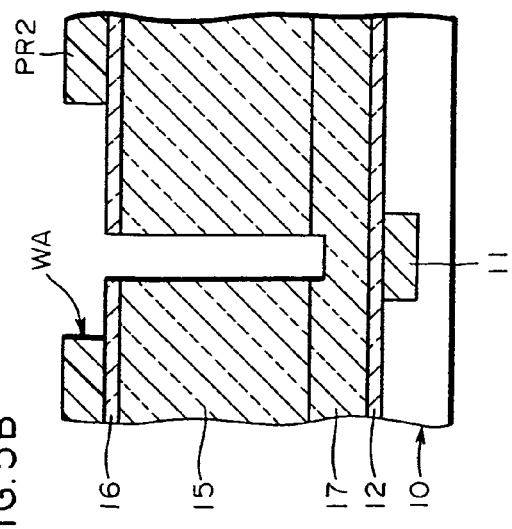

As shown in FIG. 5B, on the antireflection film 16, a resist pattern PR2 is formed which has an opening WA used for forming a wiring trench through etching.

As shown in FIG. 5C, by using the resist pattern PR2 as an etching mask, a wiring trench WG is formed in the second interlayer insulating film 15 and the first interlayer insulating film 17 under the via hole is removed, respectively through etching. This etching process is set so that the first interlayer insulating film 17 is over-etched.

Specifically, the thickness d3 of the first interlayer insulating film 17 is set so that this film 17 can be etched completely while the wiring trench WG having a depth d1 is formed in the second interlayer insulating film 15 through etching. If the first and second interlayer insulating films 17 and 15 have different etch rates, it is obvious that the etch rates are weighted.

When the first interlayer insulating film 17 having the remaining thickness of 125 nm is etched completely, the second interlayer insulating film 15 is etched by a depth of about 250 nm. If the depth d1 of the wiring trench is to be set to 500 nm, it is necessary to etch the remaining depth of about 250 nm of the second interlayer insulating film 15. If the etch rate ratio between the second interlayer insulating film 15 and the etch stopper film 12 is set to 12:1, the first etch stopper layer is etched by 250/12=20.8 nm. With this etching amount, the etch stopper layer 12 is left sufficiently and the conductive region is nearly perfectly prevented from being damaged.

Thereafter, the resist pattern PR2 is removed by ashing.

As shown in FIG. 5D, the antireflection film 16 on the second interlayer insulating film and the etch stopper layer 12 on the conductive region, respectively made of silicon nitride, are etched and removed. Thereafter, a process similar to that shown in FIG. 4H is performed to deposit a barrier layer, a seed layer and a main wiring layer to complete a dual damascene wiring layer.

Figure 6A:
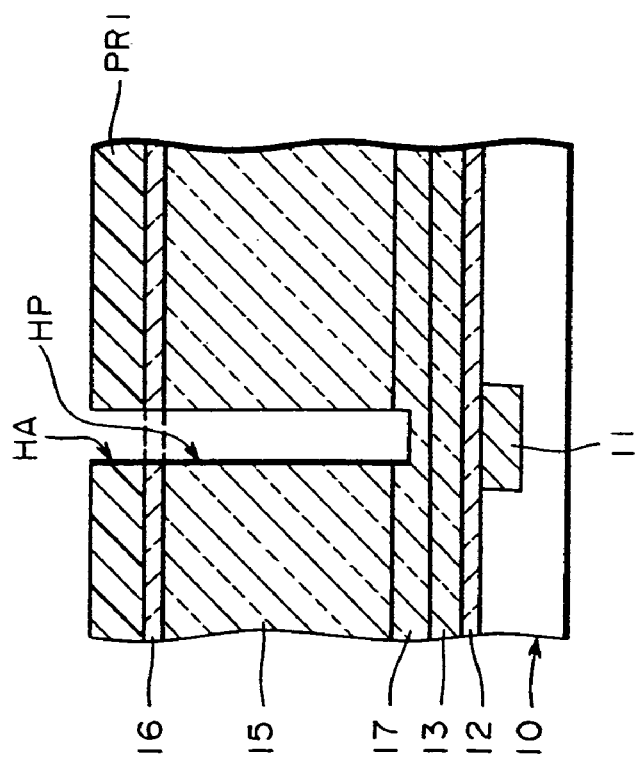
FIGS. 6A and 6B are cross sectional views of a semiconductor substrate illustrating a method of manufacturing a semiconductor device according to an embodiment of the invention.
Figure 6B:
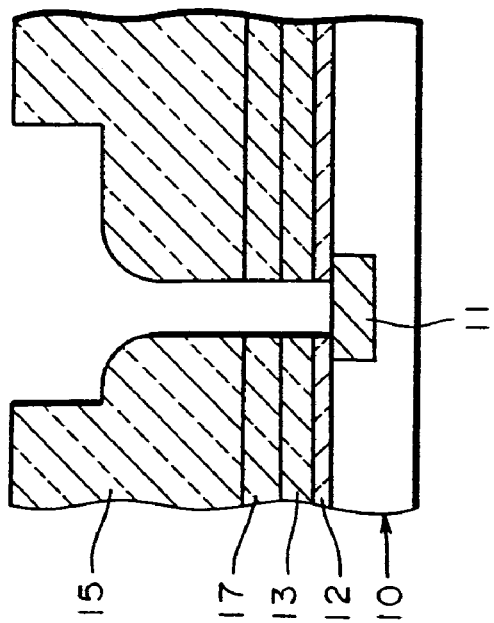

Similar to the embodiment shown in FIGS. 3A to 3E, parasitic capacitance between upper and lower wiring layers can be reduced further. FIGS. 6A and 6B illustrate an embodiment which reduces further the parasitic capacitance between upper and lower wiring layers.

As shown in FIG. 6A, the interlayer insulating film is constituted of a fluorine containing silicon oxide film 13, a plasma oxide film 17 and a fluorine containing silicon oxide film 15 deposited in this order from the bottom. The fluorine containing silicon oxide film 13 has a low dielectric constant and is effective for reducing capacitance. By executing the processes shown in FIGS. 5A to 5D, the structure shown in FIG. 6B can be formed.

In the above embodiments, the via hole opening is assumed to be disposed in an area of the wiring trench opening. For this reason, it is necessary to design a pattern by taking a position alignment margin. If a position alignment margin is small, the via hole pattern and the wiring trench pattern may be misaligned.

Figure 7A:
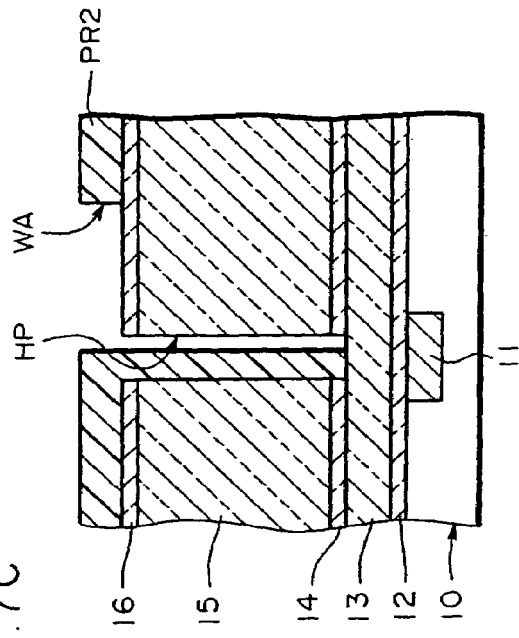
FIGS. 7A to 7D are plan views and cross sectional views illustrating a problem which may occur when there is a mask misalignment in the embodiments shown in FIGS. 4A to 6B.

FIG. 7A shows a position misalignment between a via hole opening HP and a wiring trench opening WA. Resist is embedded in the via hole area not included in the wiring trench opening WA.

Figure 7B:
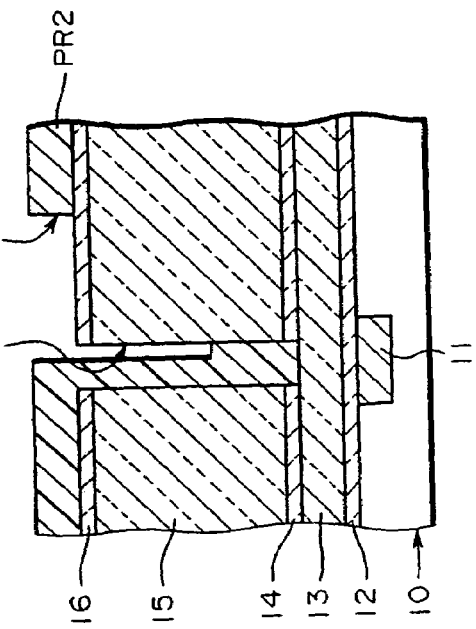

FIG. 7B shows a portion of a via hole opening HP not included in a wiring trench opening WA because of retraction of the wiring trench opening WA by the light proximity effect of the wiring trench opening WA. Also in this case, a partial area of the via hole opening HP is not included in the wiring trench opening WA so that resist in this partial area is not removed.

Figure 7C:
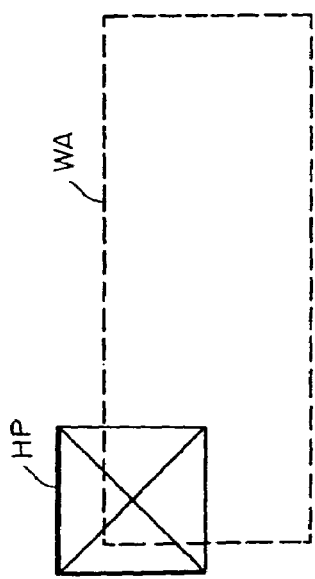

FIG. 7C is a schematic diagram showing a wiring trench forming resist pattern PR2 formed when a partial area of the via hole opening is not included in the wiring trench opening because of such position misalignment or retraction by the light proximity effect. The wiring trench opening WA extends from a partial area of the via hole HP to the upper surface of the antireflection layer. A resist pattern PR2 is embedded in the partial area of the via hole HP.

In the structure shown in FIG. 7C, although the wiring trench opening HP reaches the surface of the first interlayer insulating film 13, the cross sectional area of the via hole is reduced.

Figure 7D:
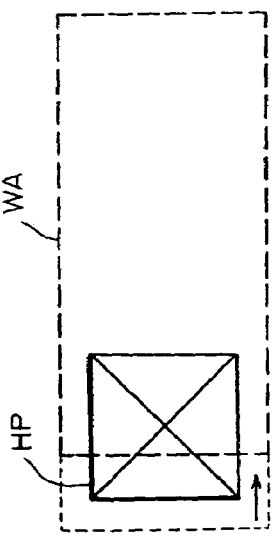

FIG. 7D illustrates a phenomenon which occurs when a position misalignment becomes larger. In this case, the opening of the resist pattern PR2, which is used as the etching mask for forming the wiring trench through etching, reaches only a small area of the via hole HP and the lower portion of the via hole HP is completely embedded with resist. Even if the etching process for the wiring trench is performed, the first interlayer insulating film 13 under the via hole is not etched at all.

A contact defect of a via conductor may occur if there is a position misalignment between the via hole opening HP and wiring trench opening WA. Another embodiment will be described which can make the via hole reliably reach the surface of the underlying conductive layer even if there is such a position misalignment.

FIGS. 8A to 8H are cross sectional views illustrating a semiconductor manufacture method according to another embodiment of the invention.

Figure 8A:
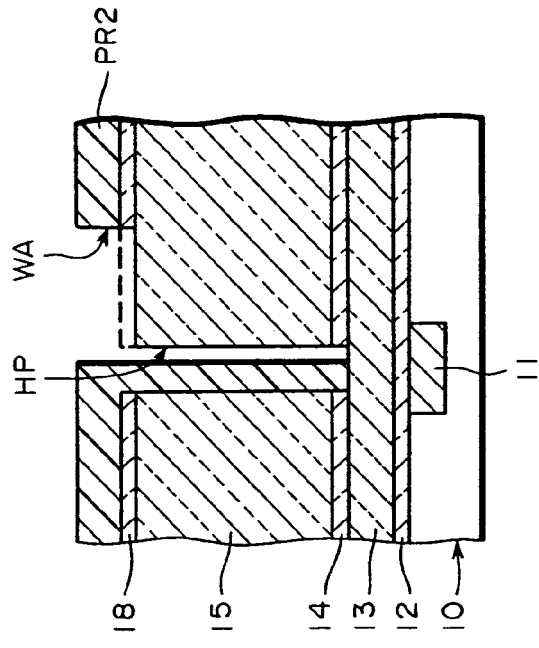
FIGS. 8A to 8H are cross sectional views of a semiconductor substrate illustrating a method of manufacturing a semiconductor device according to another embodiment of the invention.

As shown in FIG. 8A, on the surface of an underlie 10 having a conductive region 11, a lamination structure is formed which has a first etch stopper layer 12, a first interlayer insulating film 13, a second etch stopper layer 14, a second interlayer insulating film 15 and a hard mask layer 18.

The first and second etch stopper layers 12 and 14 are made of, for example, an SiN film having a thickness of 50 nm. The first interlayer insulating film 13 is made of, for example, a fluorine containing silicon oxide film having a thickness of about 300 nm. The second interlayer insulating film 15 is made of, for example, a fluorine containing silicon-oxide film having a thickness of about 900 nm. The hard mask layer 18 is made of, for example, a metal layer such as TiN having a thickness of 100 nm.

Resist is coated on the hard mask layer 18, and exposed and developed to form a resist pattern PR1 having a via hole opening HA. By using the resist pattern PR1 as an etching mask, the hard mask layer 18 is etched and thereafter the second interlayer insulating film is etched.

The hard mask layer 18 is etched, for example, by anisotropical plasma etching using Cl containing gas as etchant. The second interlayer insulating film 15 is etched, for example, by anisotropical plasma etching using mixture gas of CF containing gas and $O_2$ containing gas as etchant The etch rate ratio between the fluorine containing silicon oxide film 15 and the SiN second etch stopper film 14 is set to, for example, 12:1.

The second interlayer insulating film 15 may be etched by using the etched hard mask layer 18 as a mask. In this case, the resist pattern PR1 may be removed before the second interlayer insulating film is etched.

After the second interlayer insulating film 15 is etched, the second etch stopper layer 14 is etched. For this etching process, the resist pattern PR1 may be left as a mask or may be removed. If the resist pattern PR1 is used, it is removed thereafter by ashing.

Figure 8B:
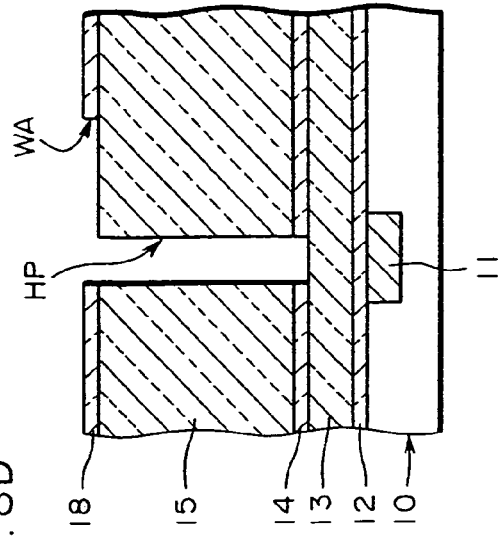

As shown in FIG. 8B, a resist pattern PR2 for forming wiring trench is formed on the hard mask layer 18. The opening WA of the resist pattern PR2 is not required to include the whole of the via hole HP.

Figure 8C:
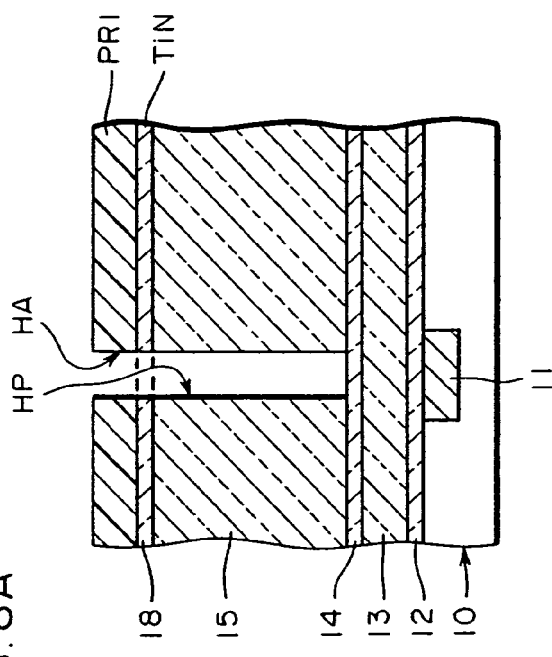

As shown in FIG. 8C, by using the resist pattern PR2 as a mask, the hard mask layer 18 is etched by using Cl containing etchant. Even if a partial area of the via hole HP is covered with resist, the hard mask layer 18 in the wiring trench forming area can be etched.

Figure 8D:
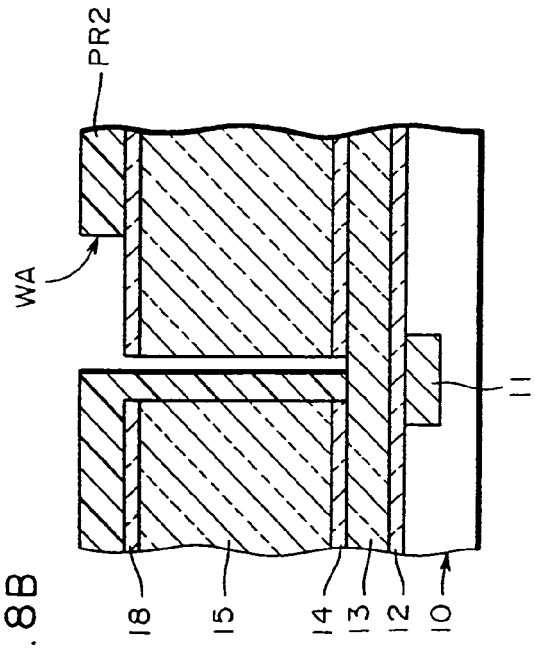

As shown in FIG. 8D, the resist pattern PR2 is removed. The resist embedded in the via hole HP is removed so that the whole of the via hole HP can be exposed. The opening WA of the hard mask layer 18 on the second interlayer insulating film 15 covers the area above the via hole HP and wiring trench forming area.

Figure 8G:
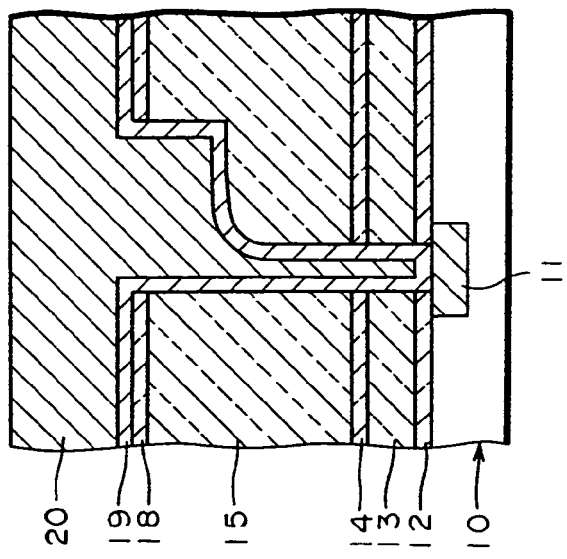
Figure 8H:
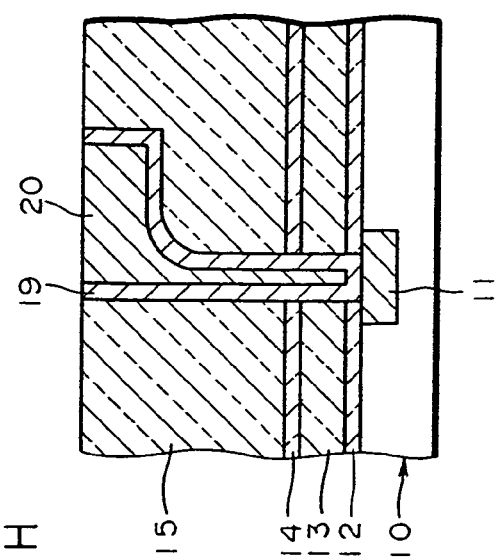
Figure 8E:
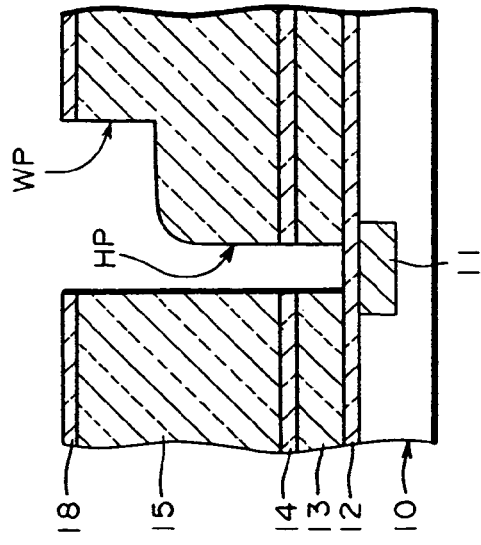

As shown in FIG. 8E, by using the hard mask layer 18 as an etching mask, the second interlayer insulating film 15 is etched through controlled etching, and then the first interlayer insulating film 13 is etched. The etching is set so that the first interlayer insulating film 13 is over-etched.

This over-etch is performed under the condition that the etch rate of the first interlayer insulating film 13 (and the second interlayer insulating film 15) is sufficiently larger than that of the first etch stopper layer 12. For example, as described earlier, mixture gas of CF containing gas and $O_2$ containing gas is used as etchant and the etch rate ratio is set to 12:1. With this etching process, a sufficient thickness of the first etch stopper layer 12 is left so that the underlying conductive region 11 can be prevented from being damaged.

Figure 8F:
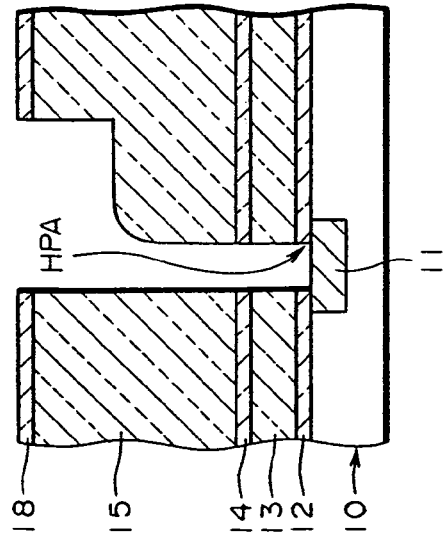

As shown in FIG. 8F, the first etch stopper layer 12 exposed at the bottom of the via hole HP is etched to form a via hole HPA exposing the conductive region 11.

As shown in FIG. 8G, similar to the above-described embodiment, a barrier metal layer 19 and a main wiring layer 20 are formed on the hard mask layer 18 and in the wiring trench and in the via hole. The barrier metal layer 19 is made of, for example, a TiN layer having a thickness of about 25 nm. The main wiring layer 20 is made of, for example, a copper layer. The barrier metal layer and main wiring layer may be formed by sputtering, plating or the like.

As shown in FIG. 8H, the main wiring layer 20, barrier metal layer 19 and hard mask layer 18 formed on the upper surface of the second interlayer insulating film 15 are removed by CMP or the like to planarize the surface of the substrate.

In this embodiment, the wiring trench is formed by using as an etching mask the hard mask transferred with the opening pattern combined with both the via hole opening and wiring trench opening. Even if there is a position misalignment between the wiring trench mask and via hole mask, the via hole without any defect can be formed because the wiring trench etching is performed after resist embedded in the via hole is removed.

The lamination structure of the interlayer insulating film of this embodiment has the etch stopper layer under each interlayer insulating film as shown in FIG. 4A. Similar manufacture processes of this embodiment are applicable to the case that the interlayer insulating film shown in FIG. 6A without an etch stopper layer is used.

FIGS. 9A to 9D are cross sectional views illustrating a method of manufacturing a semiconductor device according to another embodiment of the invention.

Figure 9A:
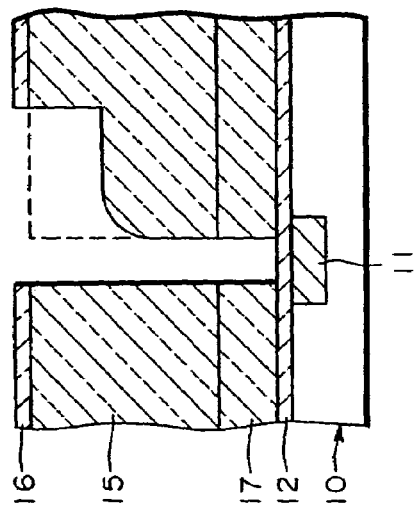
FIGS. 9A to 9D are cross sectional views of a semiconductor substrate illustrating a method of manufacturing a semiconductor device according to still another embodiment of the invention.

As shown in FIG. 9A, on the surface of an underlie 10 having a conductive region 11, a lamination structure is formed having an etch stopper layer 12, a first interlayer insulating film 17, a second interlayer insulating film 15 and a hard mask layer 16. The etch stopper layer is made of, for example, an SiN layer having a thickness of 50 nm. The first interlayer insulating film 17 is made of, for example, an $SiO_2$ film having a thickness of about 200 nm and a refractive index of n=1.5. The second interlayer insulating film 15 is made of, for example, a fluorine containing silicon oxide film having a thickness of 1000 nm. The hard mask layer 16 is made of, for example, a TiN film having a thickness of 100 nm.

On the hard mask layer 16, a resist pattern PR1 is formed having an opening HA corresponding to a via hole pattern.

By using the resist pattern PR1 as an etching mask, the hard mask layer 16 is etched by Cl containing etchant gas, and then the second interlayer insulating film 15 is etched by anisotropical plasma etching using mixture gas of CF containing gas and $O_2$ containing gas as etchant. The resist pattern PR1 is thereafter removed.

Figure 9B:
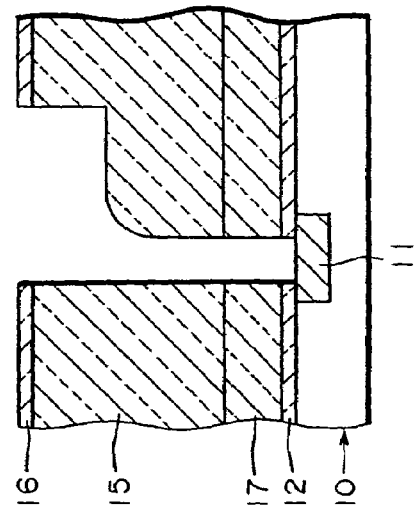

As shown in FIG. 9B, on the surface of the hard mask layer 16, a resist pattern PR2 is formed having an opening WA corresponding to a wiring trench pattern. By using this resist pattern PR2 as an etching mask, the hard mask layer 16 is etched. Although the resist pattern PR2 is embedded in the via hole because of position misalignment, a wiring trench opening continuous with the via hole can be formed in the hard mask layer 16.

Figure 9C:
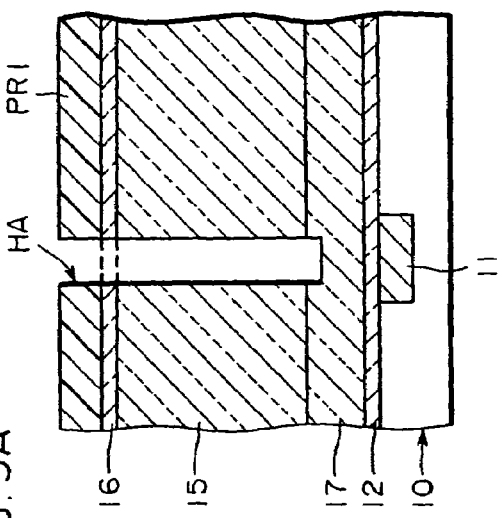
Figure 9D:
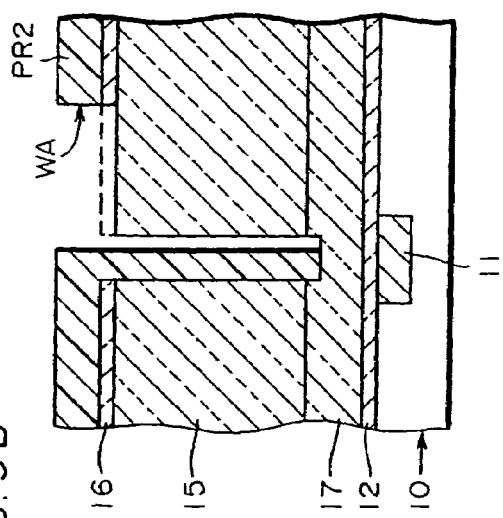

As shown in FIG. 9C, the resist pattern PR2 is removed. The resist embedded in the via hole is therefore removed and the whole via hole is exposed. By using the hard mask layer 16 as an etching mask, the second interlayer insulating film 15 is etched through controlled etching. With this etching, the first interlayer insulating film 17 under the via hole is etched so that the first etch stopper layer 12 is exposed.

In this manner, the wiring trench and the via hole continuous with the wiring trench can be formed irrespective of the mask misalignment. Thereafter, similar to the above-described embodiment, a barrier layer and a main wiring layer are formed, and the metal layers deposited on the upper surface of the second interlayer insulating film are removed by CMP or the like. In the embodiments shown in FIGS. 8A to 8H and FIGS. 9A to 9D, a large mask alignment margin can be used, the via hole can be formed reliably, and the wiring structure having better electrical characteristics can be formed. Wiring patterns can be laid out at a higher density.

In the embodiments described above, one dual damascene wiring layer is formed. In actual semiconductor devices, a multi-layer wiring structure is formed and a plurality of dual damascene structures are used at each wiring layer.

Figure 10:
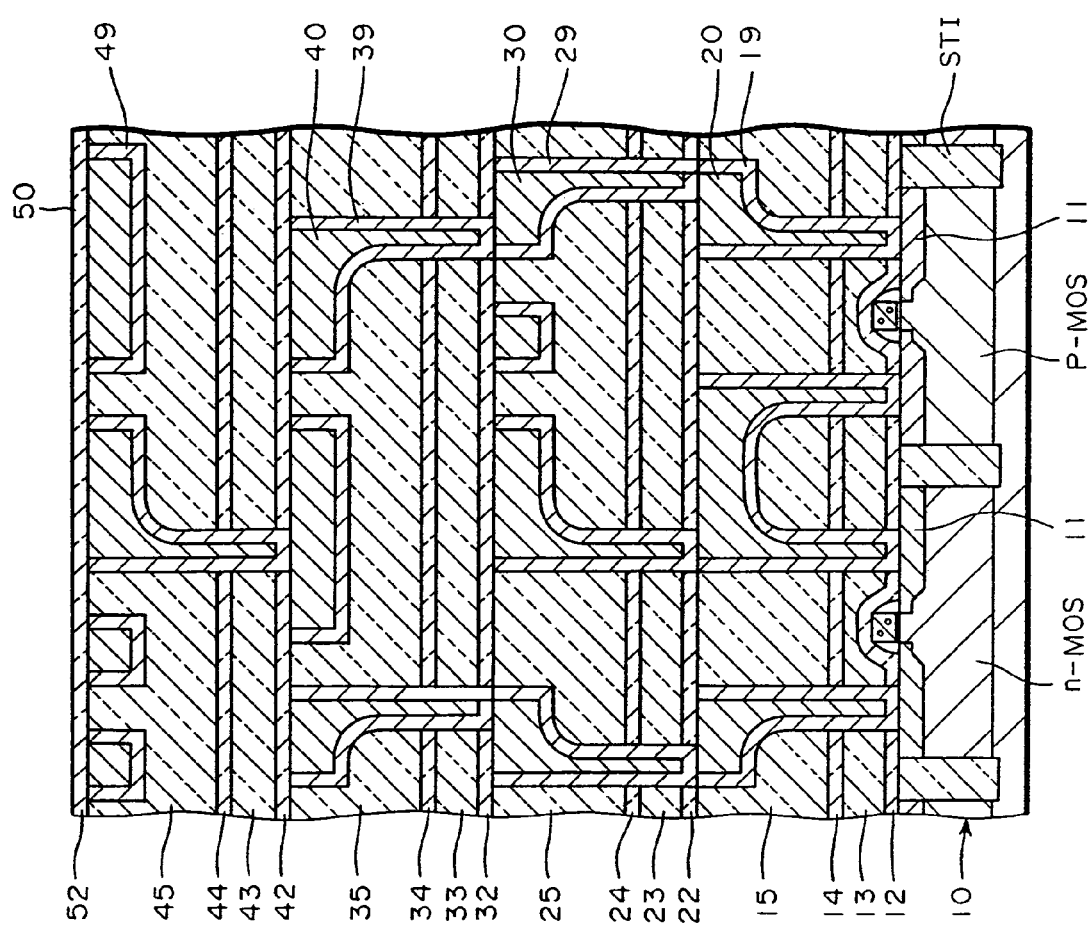
FIG. 10 is a schematic cross sectional view showing an example of the structure of a semiconductor integrated circuit device manufactured according to an embodiment of the invention.
Figure 11C:
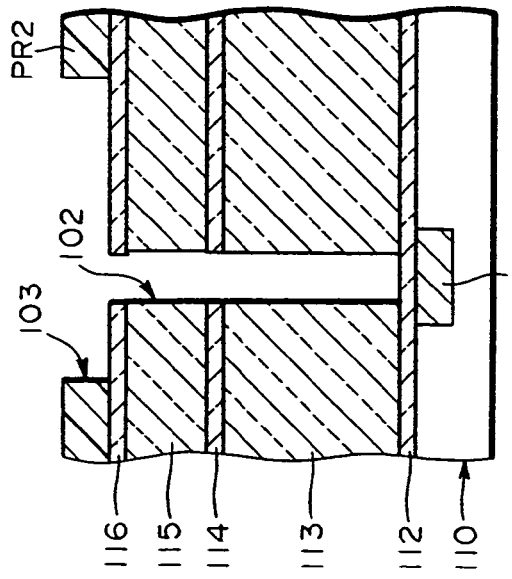
FIGS. 11A to 11H are cross sectional views of a semiconductor device illustrating a semiconductor device manufacture method according to conventional techniques.
Figure 11D:
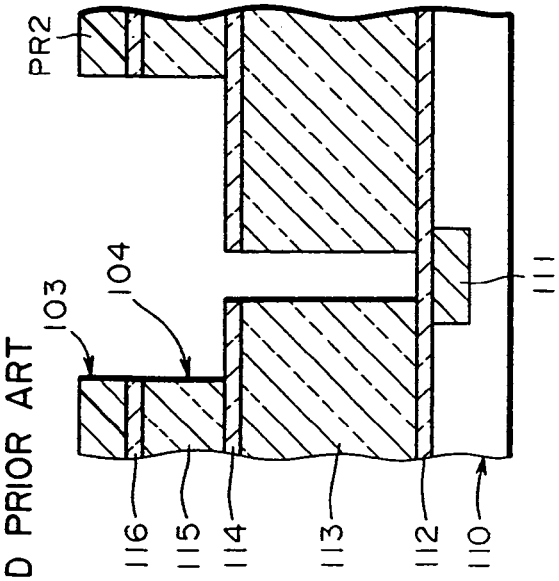
Figure 11A:
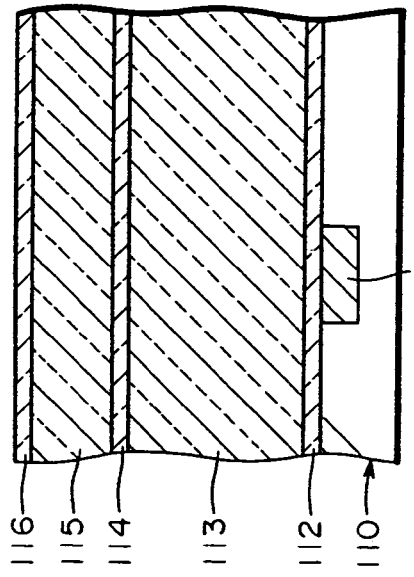
Figure 11B:
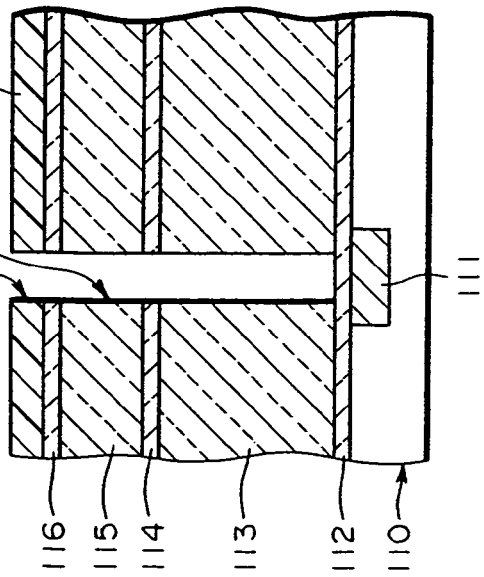
Figure 11E:
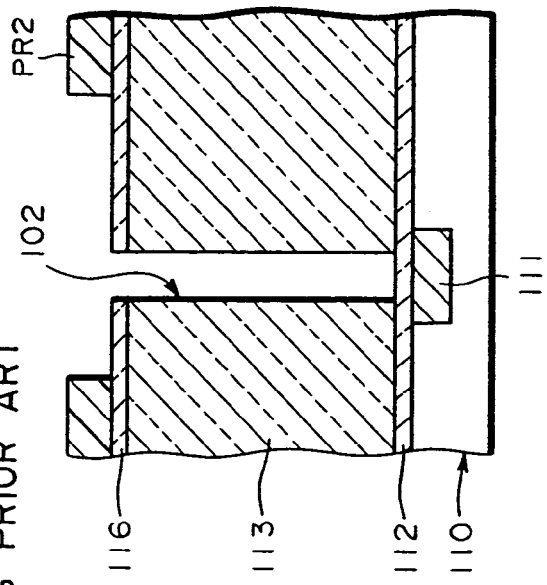
Figure 11G:
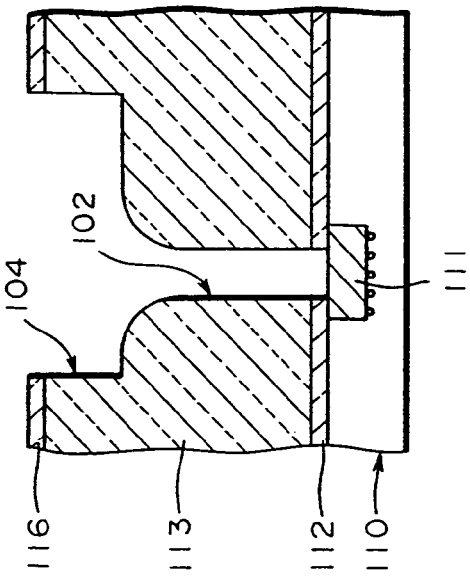
Figure 11F:
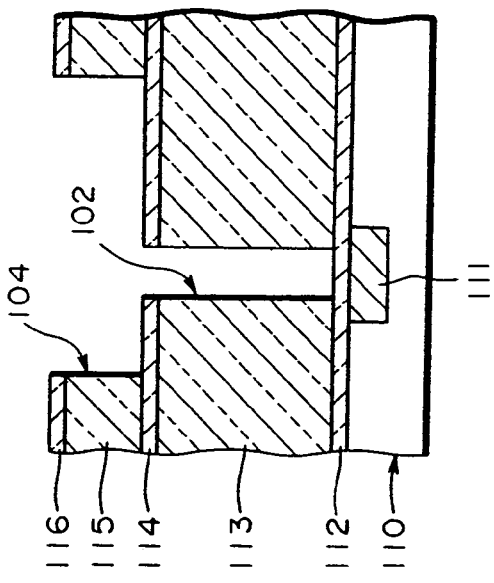
Figure 11H:
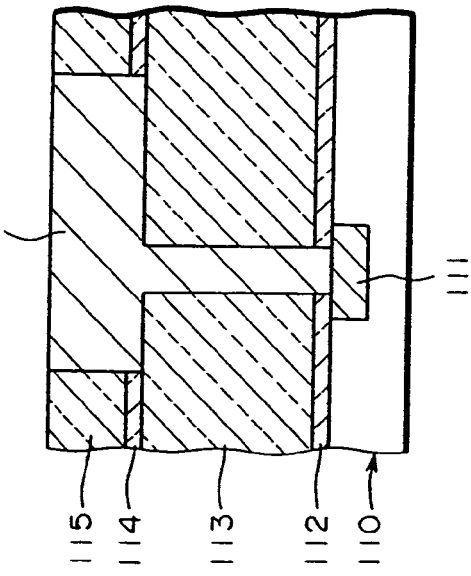

FIG. 10 is a cross sectional view showing an example of the structure of a semiconductor integrated circuit device. On the surface of a silicon substrate 10, element isolation regions STI are formed by shallow trench isolation to define active regions. In the structure shown in FIG. 10, an n-channel MOS transistor n-MOS is formed in one active region, and a p-channel MOS transistor p-MOS is formed in another active region.

Each transistor has an insulated gate electrode structure formed on the substrate surface, and n- or p-type source/drain regions 11 are formed in the substrate on both sides of the gate electrode. The source/drain regions correspond to the conductive region described in the above embodiments.

On the surface of the silicon substrate 10, a lamination structure is formed having a first etch stopper layer 12, a first interlayer insulating film 13, a second etch stopper layer 14, and a second interlayer insulating film 15. In this lamination structure, dual damascene wiring structures are formed each having a barrier layer 19 and a main wiring layer 20. These dual damascene wiring layers also correspond to the conductive region described in the above embodiments, relative to the upper wiring layer.

In the structure shown in FIG. 10, a lead wiring structure is formed on each of the opposite end conductive (source/drain) regions, and another wiring structure is formed on the central or inner conductive (source/drain) regions for interconnecting these regions. Two MOS transistors shown in FIG. 10 constitute complementary MOS (CMOS) transistors.

On the first wiring layer described above, a lamination structure is formed having a third etch stopper layer 22, a third interlayer insulating film 23, a fourth etch stopper layer 24 and a fourth interlayer insulating film 25. In this lamination structure, dual damascene wiring structures are formed each having a barrier layer 29 and a main wiring layer 30.

In the next upper wiring layer, a lamination structure is formed having a fifth etch stopper layer 32, a fifth interlayer insulating film 33, a sixth etch stopper layer 34 and a sixth interlayer insulating film 35. In this lamination structure, dual damascene wiring structures are formed each having a barrier layer 39 and a main wiring layer 40.

In the next upper wiring layer, a lamination structure is formed having a seventh etch stopper layer 42, a seventh interlayer insulating film 43, an eighth etch stopper layer 44 and an eighth interlayer insulating film 45. In this lamination structure, dual damascene wiring structures are formed each having a barrier layer 49 and a main wiring layer 50. A protective layer 52 is formed covering these dual damascene wiring structures.

These dual damascene wiring structures correspond to the dual damascene wiring structure of the above embodiments. By using dual damascene wiring structures, the multi-layer wiring structure having a high integration, a small parasitic capacitance and a small wiring resistance can be formed.

The present invention has been described in connection with the preferred embodiments. The invention is not limited only to the above embodiments. For example, the etch stopper layer may be made of a silicon oxynitride film, a silicon carbide film (SiC, SiC:H) or the like, in addition to a silicon nitride film. Films having different etch rates may be selected from: silicon oxide films formed by different compositions, densities, growth methods (CVD, vapor deposition, sputtering) or growth temperatures; silicon oxide films made from different materials such as hydrogen silsesquioxane (HSQ) and tetraethoxysilicate (TEOS); silicon nitride films, silicon oxynitride films, inorganic compound films having a siloxane bond; organic compound films and the like. A dual damascene wiring layer may be made of metal or metal compound. The metal may be gold, silver, platinum, copper, aluminum, tungsten, titanium, tantalum, molybdenum or the like, or alloy thereof. The metal compound may be titanium nitride, tantalum nitride, tungsten nitride, molybdenum nitride or the like.

It will be apparent to those skilled in the art that various modifications, improvements, combinations, and the like can be made. The dual damascene wiring layer described above may be applied to only a thick wiring layer having a thickness of, for example, 500 nm or thicker, and a conventional dual damascene wiring layer is applied to a thin wiring layer having a thickness of, for example, not thicker than 500 nm. For example, conventional wiring layers such as shown in FIGS. 11A to 11H, FIGS. 12A to 12E and FIGS. 13A to 13E are used as lower wiring layers, and embodiment wiring layers such as shown in FIG. 1A to 10 are used as upper wiring layers.

What we claim are:

1. A method of manufacturing a semiconductor device, comprising the steps of:

forming an insulating etch stopper film on an underlie having a conductive region in a surface layer of the underlie;

forming an interlayer insulating film on the insulating etch stopper film, the interlayer insulating film including a first kind of an insulating layer and a second kind of an insulating layer formed under the first kind of the insulating layer, the second kind of the insulating layer having etching characteristics different from the first kind of the insulating layer;

forming a first contact hole extending from a surface of the interlayer insulating film to the insulating etch stopper film through the interlayer insulating film;

embedding an organic protective filler in the contact hole to a height lower than a surface of the second kind of the insulating layer;

forming a wiring trench in the first kind of the insulating layer of the interlayer insulating film, the wiring trench having a first depth from the surface of the interlayer insulating film to an intermediate depth of the first kind of the insulating layer, and overlapping or including the first contact hole as viewed in plan;

removing the protective filler;

removing the insulating etching stopper film exposed in the first contact hole to form a second contact hole continuous with the first contact hole and reaching the underlie having the conductive region; and forming a dual damascene wiring layer embedded in the wiring trench and the first and second contact holes.

2. A method of manufacturing a semiconductor device according to claim 1, wherein the interlayer insulating film further includes a third kind of an insulating layer disposed under the second kind of the insulating layer, the third kind of the insulating layer having etching characteristics different from the second kind of the insulating layer.

3. A method of manufacturing a semiconductor device according to claim 2, wherein the second kind of the insulating layer has an etch rate lower than etch rates of the first and third kinds of the insulating layers.

4. A method of manufacturing a semiconductor device according to claim 1, wherein the second kind of the insulating layer includes another etch stopper layer and an underlying insulating film disposed under said another etch stopper layer, and said step of forming the first contact hole forms the first contact hole reaching the etch stopper film passing through the first kind of the insulating layer and the second kind of the insulating layer including said another etch stopper layer and the underlying insulating film.

5. A method of manufacturing a semiconductor device according to claim 1, wherein said first kind of insulating layer has a dielectric constant lower than that of silicon oxide.

6. A method of manufacturing a semiconductor device according to claim 1, wherein said first and second kind of insulating layers are made of materials selected from the group consisting of silicon oxides made by different film forming methods, silicon oxides having different composition, silicon nitride, silicon oxynitride, inorganic compound having siloxane bond, and organic compound.

7. A method of manufacturing a semiconductor device according to claim 1, wherein said insulating etch stopper film is made of a material selected from the group consisting of silicon nitride, silicon oxynitride, and silicon carbide.

8. A method of manufacturing a semiconductor device according to claim 1, wherein said underlie having a conductive region comprises a semiconductor substrate, a shallow trench isolation formed in said semiconductor substrate defining active regions, CMOS transistors formed in said active regions and having conductive source/drain regions.

9. A method of manufacturing a semiconductor device, comprising:

a step of forming an insulating etch stopper film on an underlie having a conductive region in a surface layer of the underlie;

a step of forming an interlayer insulating film on the insulating etch stopper film, the interlayer insulating film including a first kind of an insulating layer and a second kind of an insulating layer formed under the first kind of the insulating layer, the second kind of the insulating layer having etching characteristics different from the first kind of the insulating layer;

a first etching step of forming a first contact hole extending from a surface of the interlayer insulating film to the second kind of the insulating layer through the first kind of the insulating layer by etching;

a second etching step of forming a wiring trench in the first kind of the insulating layer of the interlayer insulating film and removing a remaining interlayer insulating film under the first contact hole by etching, the wiring trench having a first depth from a surface of the interlayer insulating film to an intermediate depth of the first kind of the insulating layer, and overlapping or including the first contact hole as viewed in plan;

a step of removing the insulating etch stopper film exposed in the first contact hole to form a second contact hole continuous with the first contact hole and reaching the underlie having the conductive region; and a step of forming a dual damascene wiring layer embedded in the wiring trench and in the first and second contact holes.

10. A method of manufacturing a semiconductor device according to claim 9, wherein said second etching step includes a step of etching the second kind of the insulating layer to expose the etch stopper film and a step of partially etching the exposed etch stopper film.

11. A method of manufacturing a semiconductor device according to claim 9, wherein the second kind of the insulating layer includes another etch stopper film and an underlying insulating film formed under said another etch stopper film, said first etching step includes a step of etching the first kind of the insulating layer by using a mask and a step of etching the exposed another etch stopper film, and said second etching step includes a step of etching the underlying insulating film under the first contact hole and a step of partially etching the exposed etch stopper film.

12. A method of manufacturing a semiconductor device according to claim 9, further composing the step of forming a hard mask layer on the interlayer insulating film, wherein said first etching step includes a step of forming a first resist mask on the hard mask layer, and said second etching step includes a step of forming a second resist mask on the hard mask layer and etching the hard mask layer and a step of removing thereafter the second resist mask and etching the interlayer insulating film by using the hard mask layer as an etching mask.

13. A method of manufacturing a semiconductor device according to claim 9, wherein said first kind of insulating layer has a dielectric constant lower than that of silicon oxide.

14. A method of manufacturing a semiconductor device, comprising:

a step of forming an insulating etch stopper film on an underlie having a conductive region in a surface layer of the underlie;

a step of forming an interlayer insulating film on the insulating etch stopper film, the interlayer insulating film including first, second and third kinds of insulating layers formed in this order from a bottom, the second kind of the insulating layer having etching characteristics different from the first and third kinds of the insulating layers;

a first etching step of forming a contact hole extending from a surface of the interlayer insulating film to the insulating etch stopper film through the third, second and first kinds of the insulating layers by etching;

a step of disposing an organic protective filler in the contact hole, the filler being higher than a surface of the first kind of the insulating layer and lower than a surface of the second kind of the insulating layer;

a second etching step of forming a wiring trench in the third kind of the insulating layer of the interlayer insulating film by etching, the wiring trench having a first depth from a surface of the interlayer insulating film to an intermediate depth of the third kind of the insulating layer, and overlapping or including the contact hole as viewed in plan;

a step of removing the protective filler to expose the insulating etch stopper film in the contact hole;

a third etching step of etching the exposed etch stopper film; and a step of forming a dual damascene wiring layer embedded in the wiring trench and in the contact hole.

15. A method of manufacturing a semiconductor device according to claim 14, wherein said third or first kind of insulating layer has a dielectric constant lower than that of silicon oxide.

16. A method of manufacturing a semiconductor device according to claim 14, wherein said first and third kind of insulating layers are made of materials selected from the group consisting of silicon oxides made by different film forming methods, silicon oxides having different composition, silicon nitride, silicon oxynitride, inorganic compound having siloxane bond, and organic compound.

17. A method of manufacturing a semiconductor device according to claim 14, wherein said insulating etch stopper film is made of a material selected from the group consisting of silicon nitride, silicon oxynitride, and silicon carbide.

18. A method of manufacturing a semiconductor device according to claim 14, wherein said underlie having a conductive region comprises a semiconductor substrate, a shallow trench isolation formed in said semiconductor substrate defining active regions, CMOS transistors formed in said active regions and having conductive source/drain regions.

19. A method of manufacturing a semiconductor device, comprising:

a step of forming an insulating etch stopper film on an underlie having a conductive region in a surface layer of the underlie;

a step of forming an interlayer insulating film on the insulating etch stopper film, the interlayer insulating film including first, second and third kinds of insulating layers formed in this order from a bottom, the second kind of the insulating layer having etching characteristics different from the first and third kinds of the insulating layers;

a first etching step of forming a contact hole extending from a surface of the interlayer insulating film to the second kind of the insulating layer through the third kind of the insulating layer by etching;

a second etching step of etching the second kind of the insulating layer exposed at a bottom of the contact hole;

a third etching step of forming a wiring trench in the third kind of the insulating layer of the interlayer insulating film and simultaneously etching the first kind of the insulating layer under the contact hole to expose the etch stopper film, the wiring trench having a first depth from a surface of the interlayer insulating film to an intermediate depth of the third kind of the insulating layer, and overlapping or including the contact hole as viewed in plan;

a fourth etching step of etching the exposed etch stopper film; and a step of forming a dual damascene wiring layer embedded in the wiring trench and the contact hole.

20. A method of manufacturing a semiconductor device according to claim 19, further comprising the step of forming a hard mask layer on the interlayer insulating film, wherein said first etching step includes a step of forming a first resist mask on the hard mask layer and a step of etching the hard mask layer by using the first resist mask as an etching mask, and said third etching step includes a step of forming a second resist mask on the hard mask layer and etching the hard mask layer by using the second resist mask as an etching mask and a step of removing thereafter the second resist mask and etching the interlayer insulating film by using the hard mask layer as an etching mask.

21. A method of manufacturing a semiconductor device according to claim 19, wherein said first kind of insulating layer has a dielectric constant lower than that of silicon oxide.

* * * * *